US012604683B2

(12) United States Patent　　　(10) Patent No.:　US 12,604,683 B2

Yu et al.　　　(45) Date of Patent:　Apr. 14, 2026

(54) SEMICONDUCTOR PROCESSING EQUIPMENT PART AND METHOD FOR MAKING THE SAME

(71) Applicants: FENG CHIA UNIVERSITY, Taichung (TW); DAH YOUNG VACUUM EQUIPMENT CO., LTD., Taichung City (TW)

(72) Inventors: Chang-Ho Yu, Taichung City (TW); Yao-Kuang Yang, Taichuing City (TW); Ping-Yen Hsieh, Taichung (TW); Ying-Hung Chen, Taichung (TW); Chu-Liang Ho, Taichung (TW)

(73) Assignees: FENG CHIA UNIVERSITY, Taichung (TW); DAH YOUNG VACUUM EQUIPMENT CO., LTD., Taichung City (TW)

( * ) Notice: Subject to any disclaimer, the term of this patent is extended or adjusted under 35 U.S.C. 154(b) by 0 days.

(21) Appl. No.: 18/815,625

(22) Filed: Aug. 26, 2024

(65) Prior Publication Data

US 2024/0420951 A1　　Dec. 19, 2024

Related U.S. Application Data

(63) Continuation-in-part of application No. 17/562,502, filed on Dec. 27, 2021, now abandoned.

(Continued)

(51) Int. Cl.
　　*H10P 14/60*　　　(2026.01)
　　*C23C 14/34*　　　(2006.01)
　　(Continued)

(52) U.S. Cl.
　　CPC ...... *H10P 14/6329* (2026.01); *C23C 14/3407* (2013.01); *C23C 14/54* (2013.01);
　　(Continued)

(58) Field of Classification Search
　　CPC . C23C 14/3407; C23C 14/0635; C23C 14/54; C23C 14/544
　　See application file for complete search history.

(56) References Cited

U.S. PATENT DOCUMENTS

2007/0017895 A1 * 1/2007 Yotsuya ................ C23C 14/042
　　　　　　　　　　　　　　　　　　349/149
2018/0096842 A1 * 4/2018 Varadarajan ........ H10P 14/6686
2019/0038070 A1 * 2/2019 Cao ........................ A47J 36/025

FOREIGN PATENT DOCUMENTS

CN　　　100363278 C　 *　1/2008
JP　　　 63038575 A　 *　2/1988
　　　　　　(Continued)

OTHER PUBLICATIONS

Translation to Rho (KR 2007005118) published May 2007.*

*Primary Examiner* — John J Brayton

(74) *Attorney, Agent, or Firm* — Best & Flanagan LLP

(57)　　ABSTRACT

A part is adapted to be used in a semiconductor processing equipment. The part includes a substrate and a protective coating. The protective coating covers at least a part of the substrate, is made of silicon carbide, and has an atomic ratio of carbon in the protective coating increases in a direction away from the substrate while an atomic ratio of silicon in the protective coating decreases in the direction. The atomic ratio of silicon in the protective coating is larger than that of the carbon near the substrate, and the atomic ratio of silicon in the protective coating is smaller than that of carbon near the outer surface of the protective coating. A method for making the part is also provided.

13 Claims, 27 Drawing Sheets

Related U.S. Application Data

(60) Provisional application No. 63/238,400, filed on Aug. 30, 2021.

(51) Int. Cl.
  *C23C 14/54* (2006.01)
  *H10P 14/69* (2026.01)

(52) U.S. Cl.
  CPC ...... *H10P 14/6514* (2026.01); *H10P 14/6542* (2026.01); *H10P 14/6905* (2026.01)

(56) References Cited

FOREIGN PATENT DOCUMENTS

| | | | | | | |
|---|---|---|---|---|---|---|
| JP | 2004288543 | A | * | 10/2004 | ......... | H01L 51/5253 |
| KR | 20070051188 | A | * | 5/2007 | ............ | C09K 19/56 |
| WO | WO-0116394 | A1 | * | 3/2001 | ......... | C23C 14/0036 |

* cited by examiner

SEMICONDUCTOR PROCESSING EQUIPMENT PART AND METHOD FOR MAKING THE SAME

CROSS-REFERENCE TO RELATED APPLICATION

This application is a continuation-in-part of U.S. application Ser. No. 17/562,502, filed on Dec. 27, 2021, which claims priority to U.S. Provisional Patent Application No. 63/238,400, filed on Aug. 30, 2021.

FIELD OF INVENTION

The disclosure relates to an equipment part, more particularly to a part of a semiconductor processing equipment and a method for making the part.

BACKGROUND OF THE INVENTION

In the field of semiconductor technology, various pieces of semiconductor processing equipment are required for making semiconductor chips. Those pieces of equipment may include, but not limited to, thin film deposition equipment, etching equipment, photolithography equipment, etc. Such equipment include various parts or components, e.g., focus rings, edge rings, chamber walls, etc. that requires protection in order to withstand long-term use of the processing equipment. Protective layers are often formed on substrates of the parts to provide protection to the parts. For example, new protecting layers may be formed on the substrates of the parts once the old protective layers are damaged during semiconductor manufacturing processes, allowing the parts to be reused. However, the protecting layers might be easily peeled off from the parts due to various factors, such as interlayer stress, lattice mismatch, etc. Therefore, it is desirable in the art to provide a part with a protecting layer that has superior adhesion to the substrate and that is durable enough to withstand regular use.

Furthermore, in a plasma etching process of semiconductor manufacturing, the plasma atmosphere not only etches a silicon wafer in a designed pattern but also erodes vacuum pipelines, gas nozzles, vacuum chambers, and components inside equipment, producing dust or particles. This contamination can reduce a lifespan of components and, more seriously, contaminate the silicon wafer, thereby affecting etching efficiency, wafer characteristics, and yield.

Plasma etching processes, like dry plasma etching conventionally operate in low-pressure environments, where an electromagnetic field activates reaction gases into a plasma state as gas ions. These plasma-activated gas ions then chemically react with or physically bombard target material and selectively remove it.

Dry plasma etching technology offers advantages such as anisotropic etching, high selectivity, nano-scale etching depth resolution, and absence of chemical solution contamination. These benefits make it a mainstream technology in semiconductor etching processes, compatible with conventional semiconductor vacuum processes. When fluorine-containing or chlorine-containing gases are introduced into the reaction chamber for plasma etching, an etching rate of the wafer can be controlled by adjusting plasma conditions (frequency or power), bias, plasma atmosphere, and electrode configuration. However, during the reaction process, plasma etching behaviors occur ubiquitously within the chamber. In addition to etching the target silicon wafer, the vacuum pipelines, gas nozzles, vacuum chambers, and components inside the entire plasma etching equipment are also exposed to the plasma atmosphere in prolonged periods. As a result, these components will be eroded by the plasma, leading to peeling or damaging. These dust or particles will contaminate the vacuum chamber, affecting the lifespan of the chamber, machinery, and internal components. Furthermore, this contamination can affect the processing of silicon wafer, subsequently impacting etching efficiency, wafer characteristics, and yield.

Developments of the plasma etching technology are crucial for the semiconductor processes. Therefore, developing plasma-resistant coatings for semiconductor plasma etching equipment is an urgent issue now.

SUMMARY OF THE INVENTION

According to one aspect of the disclosure, a production method of silicon carbide compounds comprising steps of: providing a hollow cathode unit; wherein the hollow cathode unit comprises two silicon targets placed parallel to each other within a case forming a slit therebetween defining a slit inlet and a slit outlet; applying a plasma power to the two silicon targets to ignite a hollow cathode discharge silicon plasma in a reduced-pressure environment; introducing a sputtering gas through the slit inlet to blow out the ho According to one aspect of the disclosure, a part is adapted to be used in a semiconductor processing equipment. The part includes a substrate made of silicon, and a protective coating that covers at least a part of the substrate. An atomic ratio of carbon in the protective coating increases in a direction away from the substrate, and an atomic ratio of silicon in the protective coating decreases in the direction. The atomic ratio of silicon in the protective coating is larger than that of carbon near the substrate and the atomic ratio of silicon in the protective coating is smaller than that of carbon near the outer surface of the protective coating.

In accordance to above description, the present invention has the following beneficial effects and advantages:

1. The present invention utilizes a new sputtering technology to develop a high-speed growth process for silicon carbide compound films with excellent plasma-resistant properties. These films can be applied to the surface of various components of the internal surface of plasma etching equipment, thereby increasing the lifetime of these components, preventing chamber contamination, and improving wafer characteristics and yield.

2. The silicon carbide compound films produced by the present invention have controllable silicon/carbon composition, high growth rate, and plasma-resistant properties. This enables their application in the surface of various components of the internal surface of plasma etching equipment, thus increasing their lifetime, preventing chamber contamination, and improving wafer characteristics and yield.

BRIEF DESCRIPTION OF THE DRAWINGS DETAILED DESCRIPTION OF

Other features and advantages of the disclosure will become apparent in the following detailed description of the embodiment with reference to the accompanying drawings, of which:

THE PREFERRED EMBODIMENTS

Figure 1:
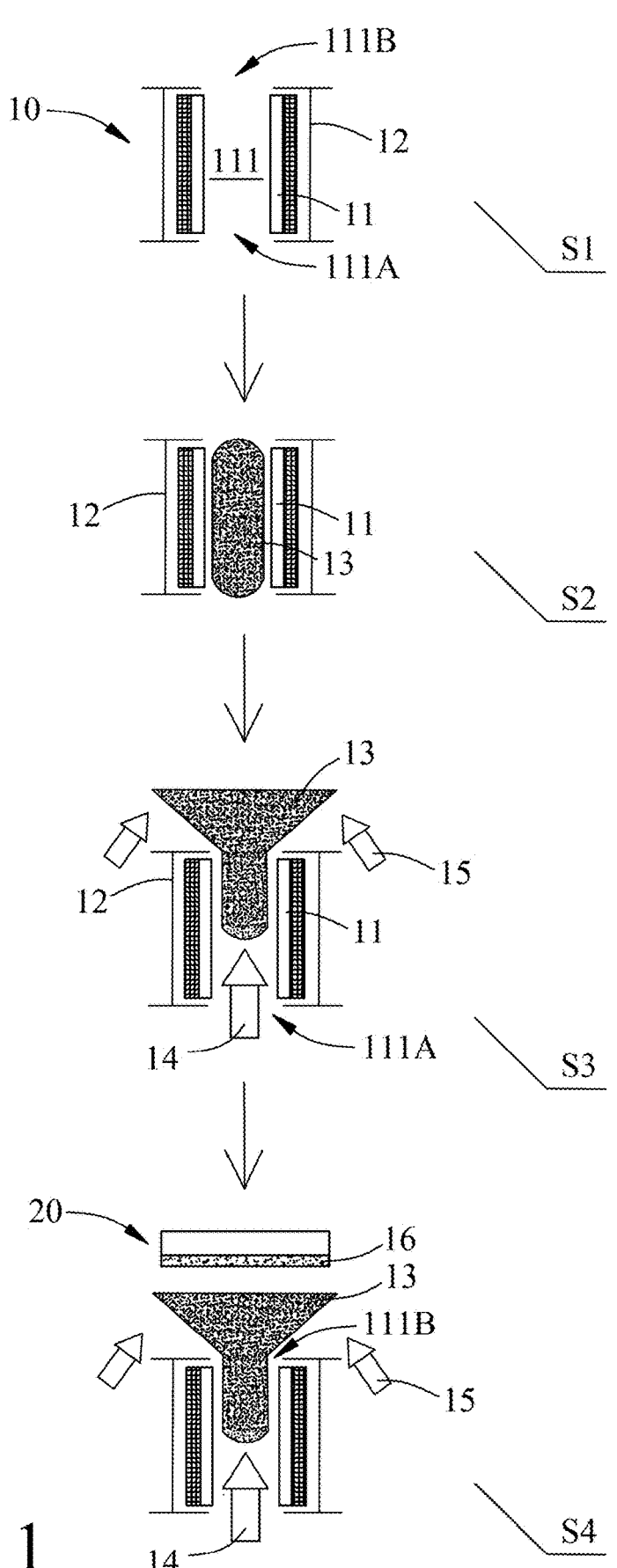
FIG. 1 is, in accordance with some embodiments, a flow chart of a method for making a part adapted to be used in a semiconductor processing equipment.

Before the disclosure is described in greater detail, it should be noted that where considered appropriate, reference numerals or terminal portions of reference numerals have been repeated among the figures to indicate corresponding or analogous elements, which may optionally have similar characteristics.

Embodiment 1

With reference to FIG. 1, a flowchart illustrates a preferred embodiment of a production method of silicon carbide compounds according to the present invention comprising steps of:

Step S1) Providing a hollow cathode unit 10. The hollow cathode unit 10 comprises two silicon targets 11 placed parallel to each other within a mask 12, forming a slit 111 between the two silicon targets 11, defining a slit inlet 111A and a slit outlet 111B.

Step S2) Applying a plasma power to the two silicon targets 11 to excite a hollow cathode discharge silicon plasma 13 in a reduced-pressure environment and preferred in a chamber (now shown in the figure);

Step S3) Introducing a sputtering gas 14 through the slit inlet 111A to blow out the hollow cathode discharge silicon plasma 13, and introducing a hydro-carbon gas 15 near the slit outlet 111B. The hydro-carbon gas 15 of the present invention is preferred to be non-ionized gas.

Step S4) Reacting the hollow cathode discharge silicon plasma 13 with the hydro-carbon gas 15 to form a silicon carbide compound film 16 to coat at least a part or an entire surface of a substrate 20.

In the aforementioned Step S3, a flow rate of the sputtering gas 14 and/or the hydro-carbon gas 15 are preferred to be controlled by a mass flow controller.

The silicon target 11 comprises monocrystalline silicon, polycrystalline silicon, amorphous silicon, or a combination thereof. Monocrystalline silicon is used for this preferred embodiment. The sputtering gas 14 preferably comprises an sputtering gas, such as helium, argon, or krypton. Argon is used for this preferred embodiment. The hydro-carbon gas 15 is a gas containing carbon and hydrogen such as methane, ethane, ethylene, propylene, acetylene, or combination thereof. The substrate 20 could be any substrate includes metallic or non-metallic surfaces. The non-metallic surfaces include ceramics or polymers.

The silicon carbide compound film 16 is a compound formed by the reaction of the hollow cathode discharge silicon plasma 13 (silicon source) and the hydro-carbon gas 15 (carbon source), which can be represented by the molecular formula $Si_xC_y$, where x and y represent mole numbers of silicon and carbon, respectively, and can be any number, preferably positive number, more preferably positive integer. When the x/y mole ratio is 1, it is stoichiometric silicon carbide; when the x/y mole ratio is less than 1, it is non-stoichiometric and carbon-rich silicon carbide compound; when the x/y mole ratio is greater than 1, it is non-stoichiometric and silicon-rich silicon carbide compound.

Figure 2:
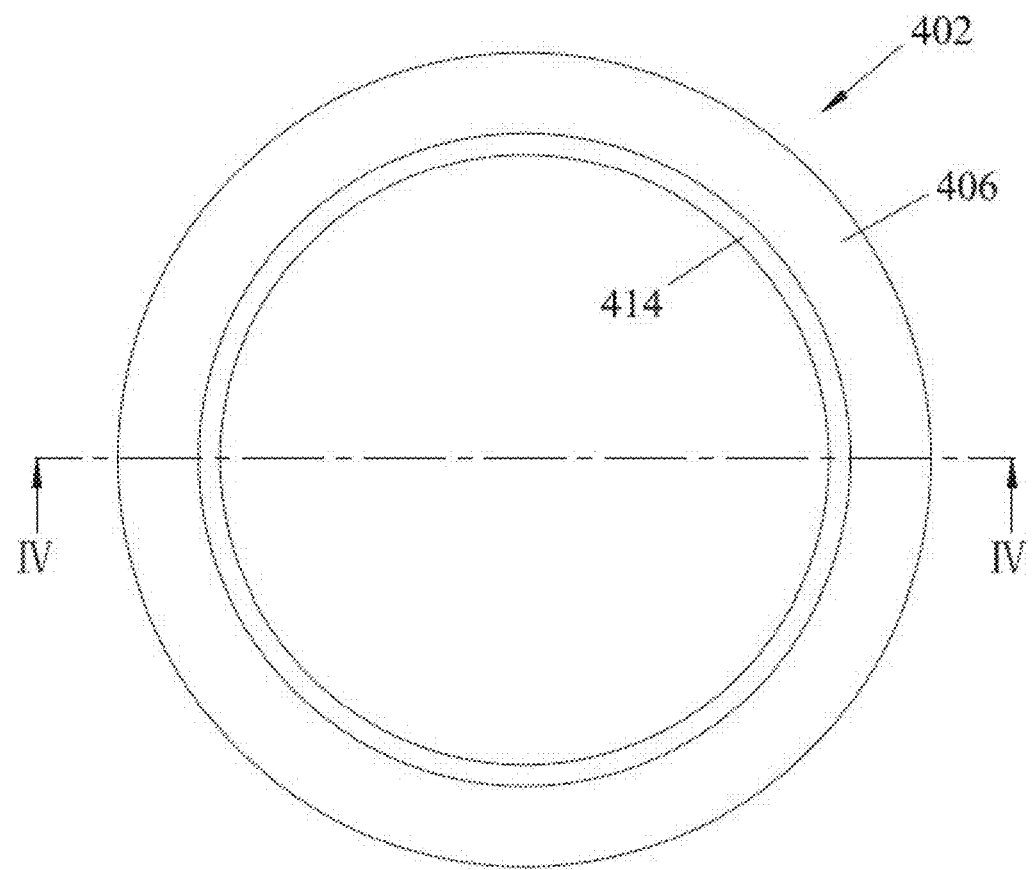
FIG. 2 is a schematic top view of a substrate of the part in accordance with some embodiments.
Figure 3:
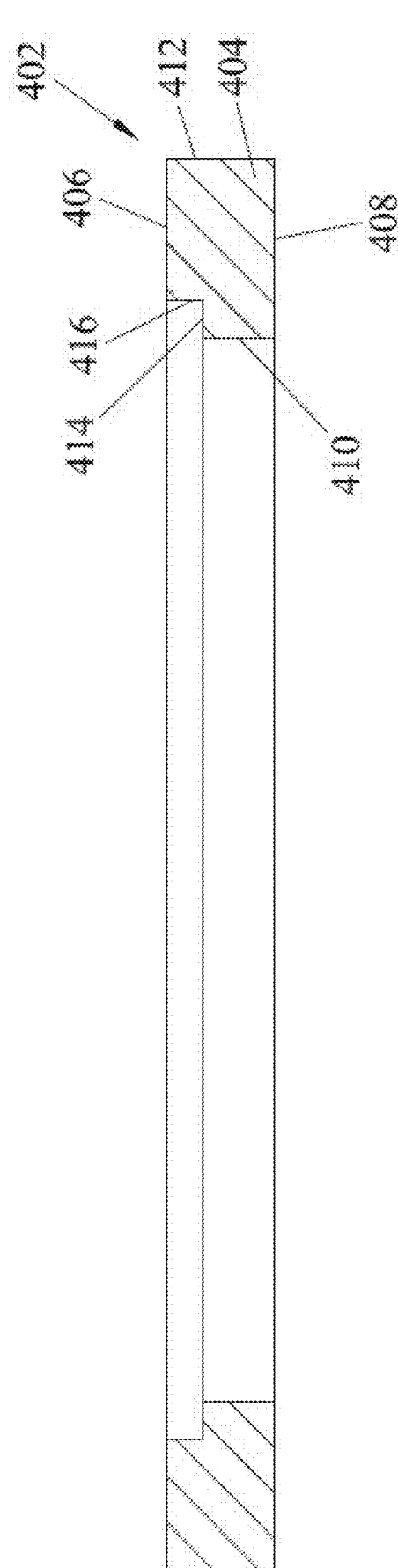
FIG. 3 is a schematic sectional view taken from line IV-IV of FIG. 3.

Referring to FIG. 2, in some embodiments, the aforementioned substrate 20 (hereinafter in the FIG. 2 as 402) is a closed-loop object, and is exemplified to be ring-shaped, but other suitable shapes are also possible, according to practical requirements. A cross-section of the substrate 402 along line IV-IV of FIG. 2 is shown in FIG. 3. In some embodiments as shown in FIG. 2 and FIG. 3, the substrate 402 has a main body 404 that has opposite inner and outer surfaces 410, 412, opposite upper and lower surfaces 406, 408, and a horizontal surface 414 and vertical surface 416 that cooperates with the horizontal surface 414 to define a step. In some embodiments, the horizontal surface 414 may be substantially perpendicular to the inner surface 410; but in other embodiments, the horizontal surface 414 may be inclined relative to the inner surface 410. In some embodiments, the vertical surface 416 may be substantially perpendicular to the upper surface 406; but in other embodiments, the vertical surface 416 may be inclined relative to the upper surface 406.

Referring to FIG. 1, in step S3, an sputtering gas is introduced into the chamber through a gas inlet (not shown) of the chamber. In some embodiments, the sputtering gas may be Ar, He, Ne, Kr, or any combination thereof. In some embodiments, the flow rate of the sputtering gas may range from 0.1 slm to 100 slm, but other ranges are also possible based on practical requirements.

The hydro-carbon gas is preferrably introduced into the chamber through another gas inlet (not shown) of the chamber. In some embodiments, the hydro-carbon gas includes an element of carbon (e.g., $C_2H_2$, $CH_4$, etc.). In some embodiments, the hydro-carbon gas may be a hydro-carbon gas having a formula of $C_nH_{(2n-2)}$, $C_nH_n$, $C_nH_{(2m+2)}$, or other suitable formulas, where n is a positive integer. In some embodiments, the flow rate of the hydro-carbon gas may range from 0.1 sccm to 1000 sccm, but other ranges are also possible based on practical requirements.

Figure 4:
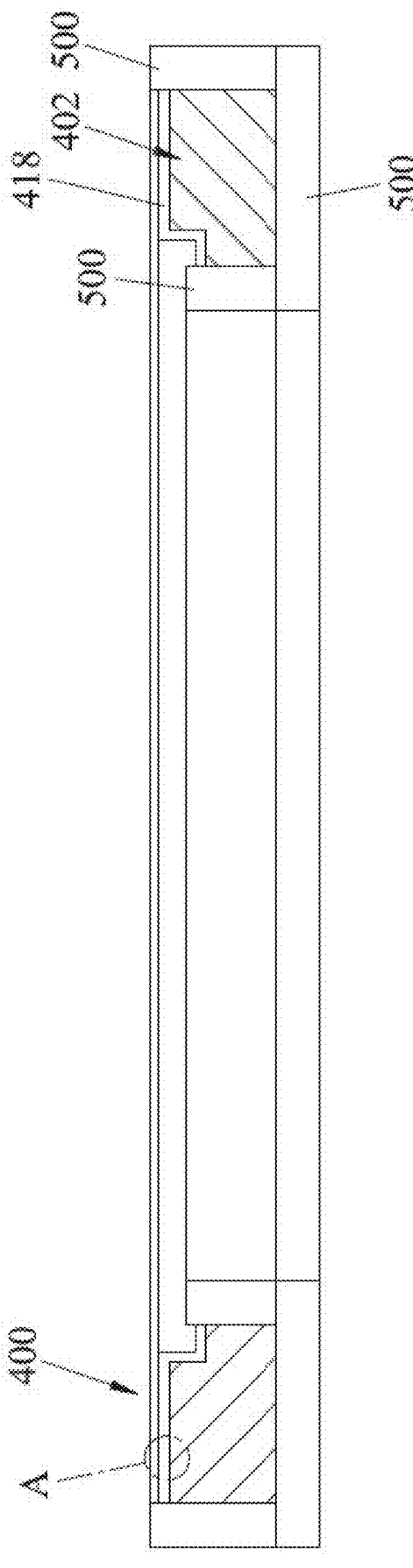
FIG. 4 is a schematic view showing a protective coating being formed on the substrate.

Referring to FIG. 1, the sputtering gas is ionized into plasma including ions that bombard the silicon targets 11, causing silicon atoms and/or silicon ions to sputter out from the silicon targets 11 and to react with the hydro-carbon gas so as to form the silicon carbide compound film 16 or a protective coating 418 as shown in FIG. 4 and onward made of silicon carbide that covers at least a part of the substrate 402, thereby obtaining the part 400 which includes the substrate 402 and the protective coating 418 covering at least a part of the substrate 402. The protective coating 418, for example, can protect the substrate 402 of the part 400 from being damaged by dry etch gas (e.g., $Cl_2$, $F_2$, $O_2$, $CF_4$, $C_3F_8$, $CHF_3$, $XeF_2$, $SF_6$, HBr, chloride gases, etc.) when the part 400 is used in an etching equipment. In some embodiments, a plasma power for ionizing the sputtering gas ranges from 0.1 kW to 100 kW, but other ranges are also possible based on practical requirements. In some embodiments, the protective coating 418 is formed at a rate of not less than 5 μm/h, and preferably over 10 μm/h. In some embodiments, the protective coating 418 may have a minimum thickness not less than 150 μm. Referring further to FIG. 4, in some embodiments, a plurality of covering units 500 may be attached to the substrate 402 during the formation of the protective coating 418, such that only a desired part of the substrate 402 is exposed and formed with the protective coating 418. For example, as shown in FIGS. 3 and 4, the lower surface 408, the inner surface 410 and the outer surface 412 of the main body 404 of the substrate 402 may be covered by the covering units 500 such that only the upper surface 406, the horizontal surface 414 and the vertical surface 416 of the substrate 402 are covered with the protective coating 418. After forming the protective coating 418, the covering units 500 are removed from the substrate 402. In some embodiments, the covering units 500 may be jigs, masks, tapes, any combination thereof, or other suitable materials.

Figure 5:
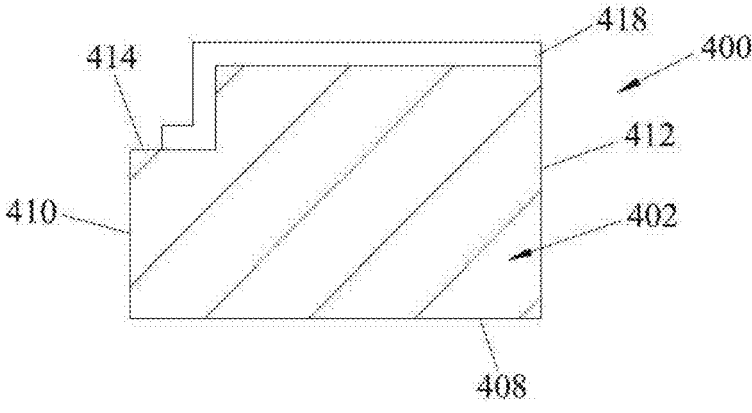
FIGS. 5 to 10 are schematic views showing different variations of the protective coating.
Figure 6:
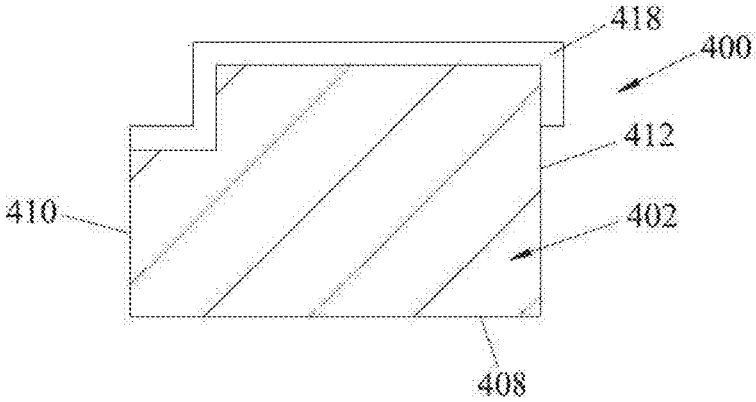
Figure 7:
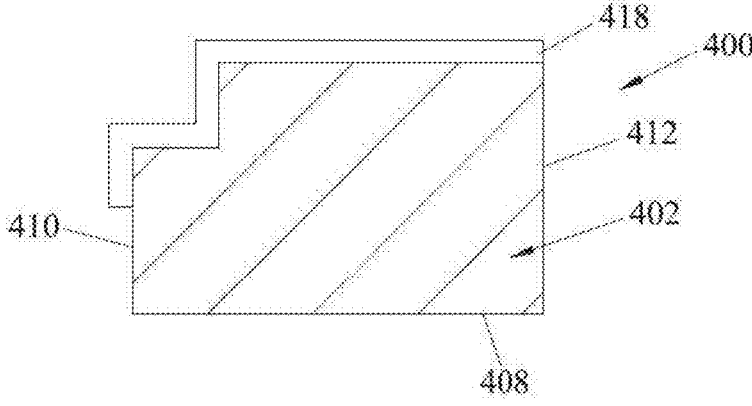
Figure 8:
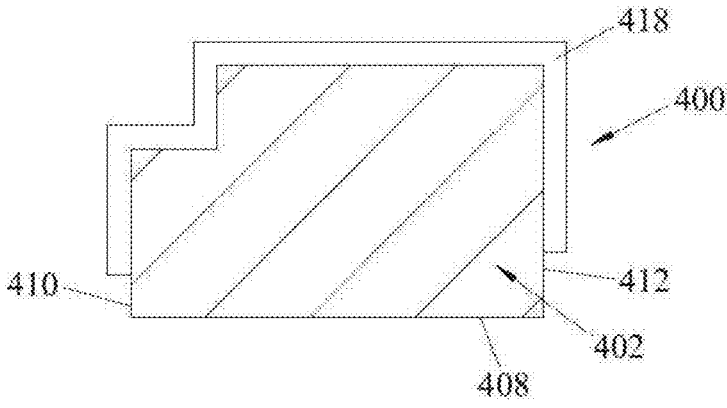
Figure 9:
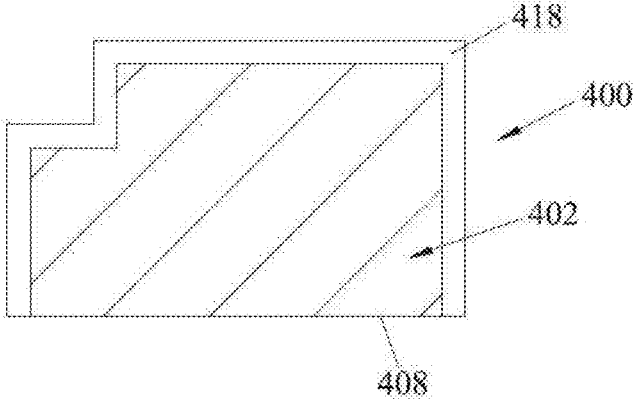
Figure 10:
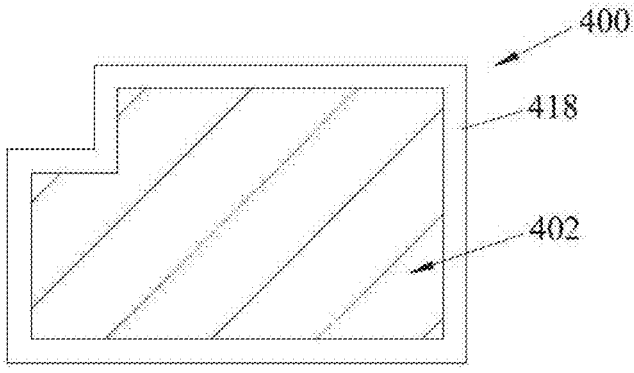

FIGS. 5 to 10 schematically show different variations of the silicon carbide compound film 16 or the protective coating 418. Referring to FIGS. 3 and 5, the protective coating 418 may cover the upper surface 406, the vertical surface 416 and a part of the horizontal surface 414 of the substrate 402. Referring to FIGS. 3 and 6, the protective coating 418 may cover the upper surface 406, the vertical surface 416, the horizontal surface 414 and a part of the outer surface 412 of the substrate 402. Referring to FIGS. 3 and 7, the protective coating 418 may cover the upper surface 406, the vertical surface 416, the horizontal surface 414, and a part of the inner surface 410 of the substrate 402. Referring to FIGS. 3 and 8, the protective coating 418 may cover the upper surface 406, the vertical surface 416, the horizontal surface 414, a part of the inner surface 410 and a part of the outer surface 412 of the substrate 402. Referring to FIGS. 3 and 9, the protective coating 418 may cover the upper surface 406, the vertical surface 416, the horizontal surface 414, the inner surface 410 and the outer surface 412 of the substrate 402. Referring to FIGS. 3 and 10, the protective coating 418 may entirely cover the main body 404 of the substrate 402, including the upper surface 406, the lower surface 408, the inner surface 410, the outer surface 412, the horizontal surface 414, and the vertical surface 416.

In addition, each of the examples shown in FIGS. 3 to 9 may be selectively added with an anti-warpage layer (not shown) on the lower surface 408 in case the stress of the protective coating 418 causes the substrate 402 to bend. The material of the anti-warpage layer may also be selected as silicon carbide but is not limited to silicon carbide as long as it can compensate the warpage of the substrate 402.

Figure 11:
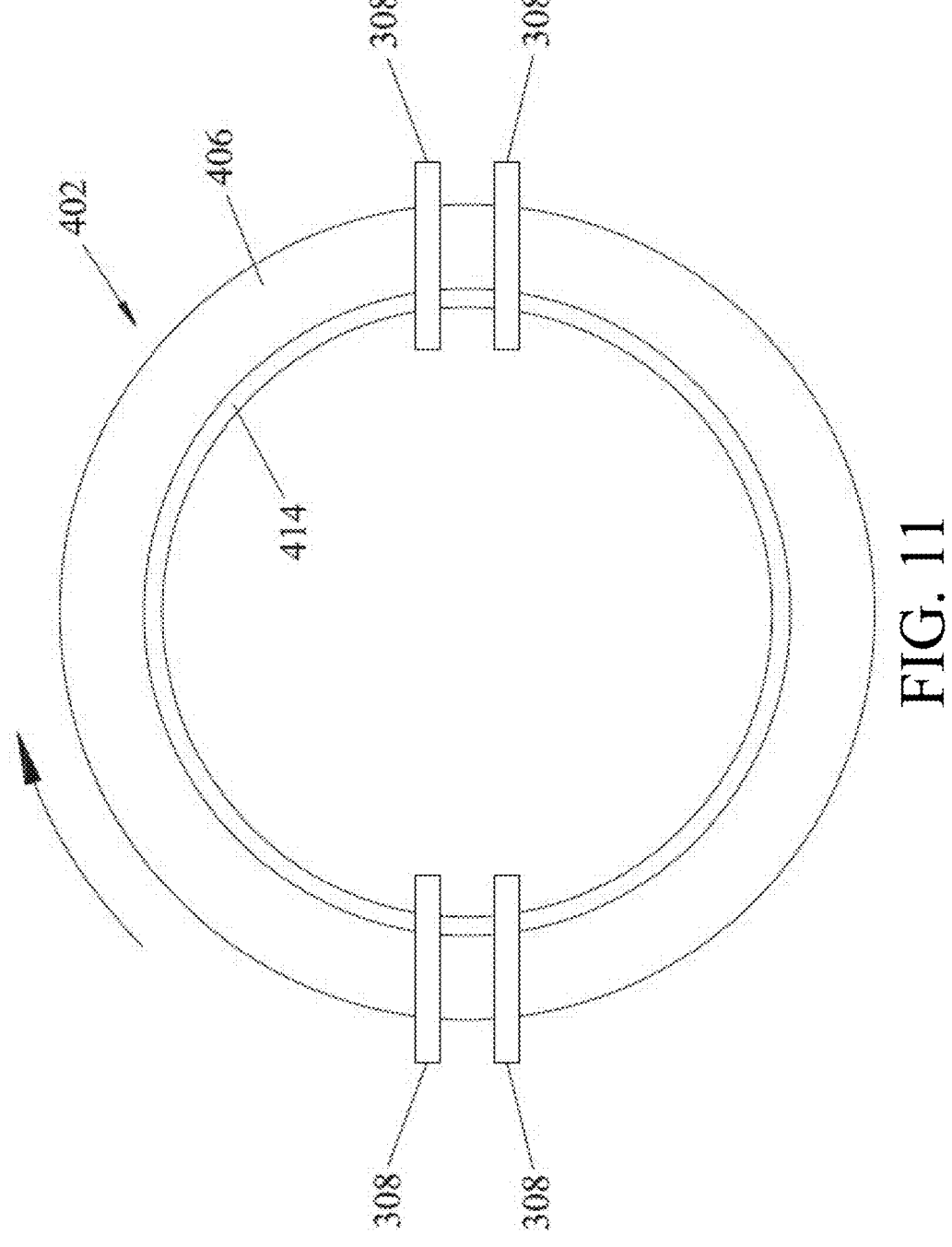
FIGS. 11 and 12 shows different arrangements of silicon targets of the reactive physical vapor deposition equipment.
Figure 12:
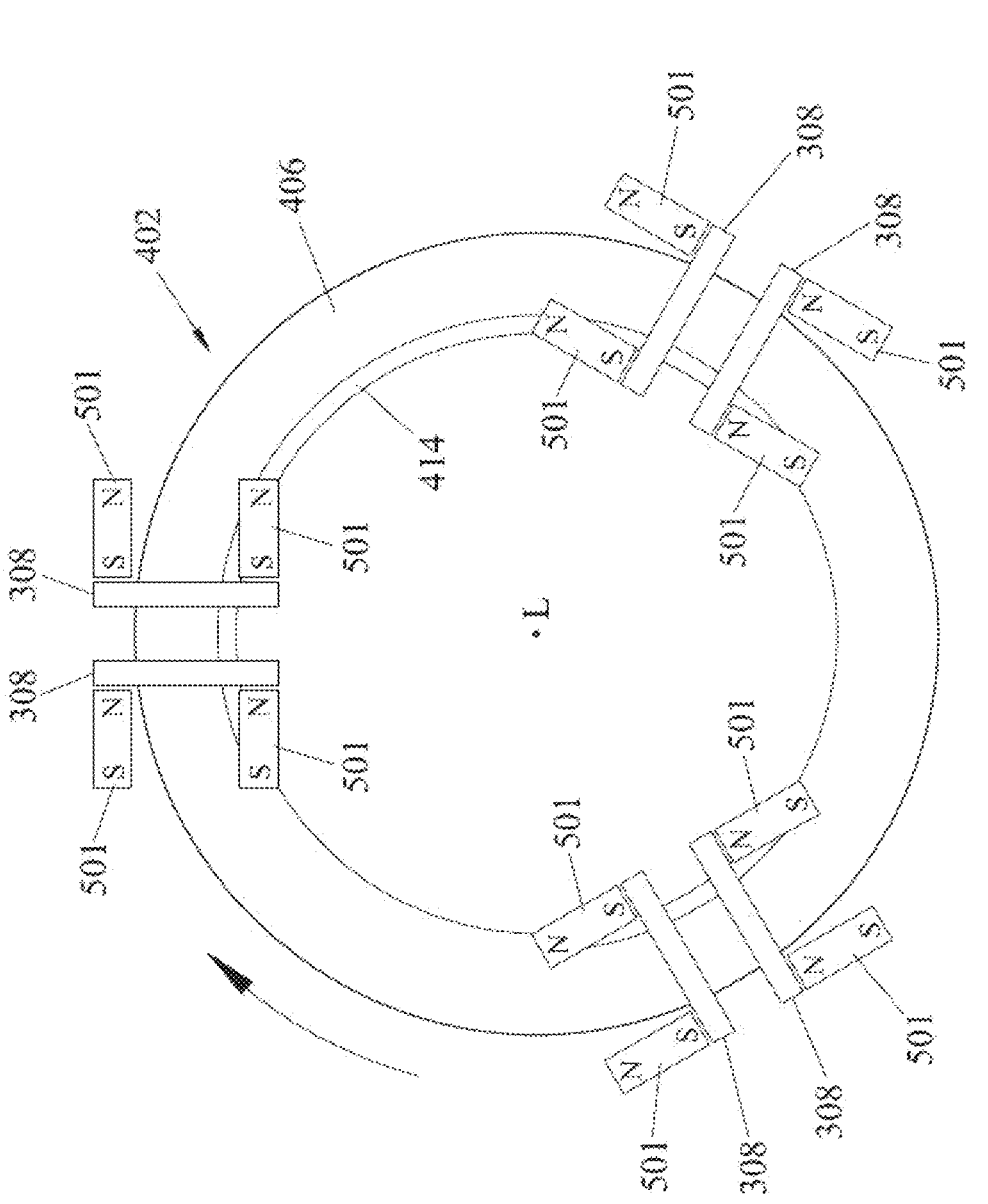

Referring to FIGS. 1, in some embodiments, an even number of the silicon targets 11 are placed in the chamber. In some embodiments, the silicon targets 308 as shown in FIG. 11 are arranged in at least one pair with the silicon targets 308 facing each other. Specifically, if the number of the silicon targets 308 is two, the silicon targets 308 may be mounted to the chamber to be located opposite to each other, or may be placed closer to each other (see FIG. 11) with a short distance such as several millimeters to hundreds of millimeters. With the number of the silicon targets 11 or 308 being even, the plasma and/or the gas atoms/ions would be more likely to bombarde the silicon targets 308, which may result in formation of a denser silicon carbide protective coating 418. If the number of the silicon targets 308 is greater than two, such as four, six, eight, etc., the silicon targets 308 may be arranged as multiple pairs. For example, as shown in FIG. 12, there are three pairs of silicon targets 308 disposed above the substrate 402 by equiangular arrangement. In some embodiments, the substrate 402 such as a closed-loop object or ring rotates about a virtual center axis (L) during formation of the protective coating 418 in order to adjust or improve the uniformity of the protective coating 418. In some embodiments, two sides of each pair of the silicon targets 308 are provided with magnets 501 to produce magnetic field to control the plasma located within the magnetic field in order to improve efficiency of forming the silicon atoms/ions or adjust plasma erosion uniformity of the pair of the silicon targets 308.

Referring to FIGS. 3 to 10, in some embodiments, the substrate 402 may be biased to have a lower voltage relative to the plasma. For example, when the plasma is positively charged (e.g., plasma containing $Ar^+$), the substrate 402 is negatively changed, thereby attracting some ions of the plasma to bombard the substrate 402. The attracted ions of plasma may clean the surfaces of the substrate 402 by removing native oxidized layers formed thereon when the substrate 402 is exposed to air, moisture or other substances. Furthermore, the plasma having gas ions such as $Ar^+$ may create dangling bonds on the surfaces of the substrate 402 which may be reactive to the silicon atoms, silicon ions, carbons, and/or silicon carbide. Therefore, the protective coating 418 may be physically and/or chemically connected to the substrate 402 (e.g., the protective coating 418 is connected to the substrate 402 through chemical bonding with the dangling bonds), so that the protective coating 418 may be more firmly adhered to the substrate 402.

Referring to FIGS. 3-10, in some embodiments, the substrate 402 may be heated by the heater 306, such that the protective coating 418 may be more firmly adhered to the substrate 402 and/or the crystallinity of the protective coating 418 may be increased (i.e., the protective coating 418 being made denser). The heating temperature may be any temperature ranging from room temperature to a temperature lower than the melting points of the substrate 402 and the protective coating 418 (i.e., silicon carbide).

In some embodiments, during the formation or deposition of the protective coating 418, a holder (not shown in Figures) that is disposed in the chamber, and a plurality of silicon targets 308 that are placed in the chamber. In some embodiments, the silicon targets 308, in even numbers, may be disposed parallel to each other above and perpendicular to the holder. In some embodiments, the present invention further includes a heater that is used for heating the holder. The heater may be a graphite heater, an IR laser heater or other suitable heating devices. The heater may be disposed in the chamber or outside of the chamber, as long as the holder can be effectively heated.

In some preferred embodiments, the holder may be rotated, horizontally moved, and/or vertically moved to rotate or move the substrate 402 for various purposes, e.g., adjusting the uniformity of the protective coating 418, etc.

Validation Tests for Embodiment 1

Figure 13:
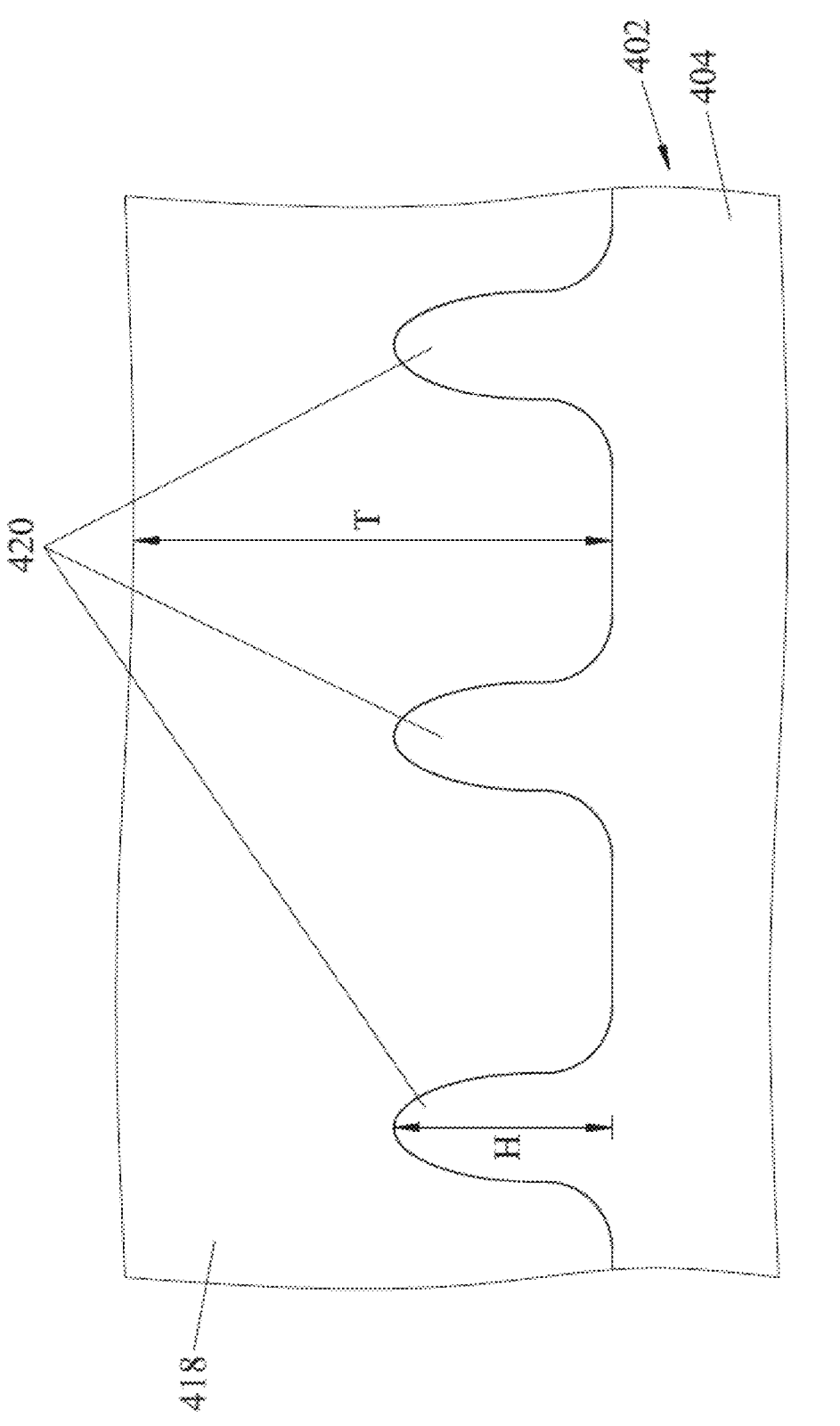
FIG. 13 is an enlarged schematic view showing a plurality of microstructures of the substrate.
Figure 14:
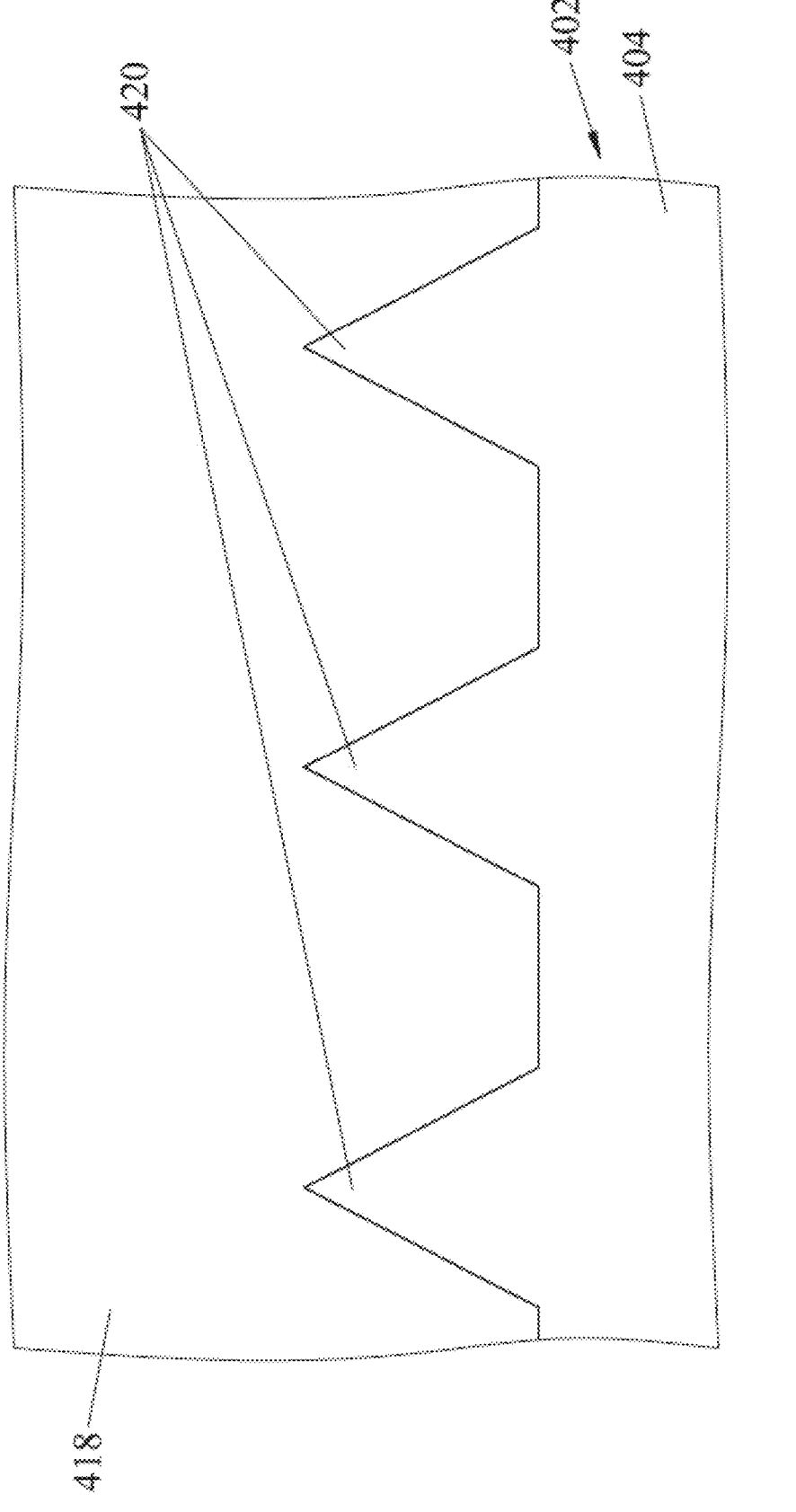
FIG. 14 is enlarged schematic view showing a variation of the microstructures having pyramid shape of the substrate.

FIG. 13 is a schematic sectional view taken from circle (A) shown in FIG. 4. In some embodiments as shown in FIG. 3, the main body 404 of the substrate 402 may be formed with a plurality of microstructures 420 such as protrusions before the formation of the protective coating 418, such that, after the protective coating 418 is formed on the main body 404 of the substrate 402, the stress between the substrate 402 and the protective coating 418 can be reduced and the protective coating 418 can be more firmly attached to the substrate 402. In some embodiments, each of the microstructures 420 may have a height (H) in a range from 300 nm to 1.5 μm and the protective coating 418 thereon has a minimum thickness (T) of not less than 10 μm. Referring to FIG. 14, in some embodiments, each of the microstructures 420 is pyramid-shaped and has a triangular cross-section. The microstructures 420 may be formed by etching the substrate 402 with a suitable etchant, may be formed by deposition techniques, or formed using other suitable techniques. In some embodiments, the substrate 402 made of silicon may be etched by potassium hydroxide (KOH), tetramethyl ammonium hydroxide (TMAH), ethylenedi-amine pyrocatechol (EDP), etc.

Figure 15:
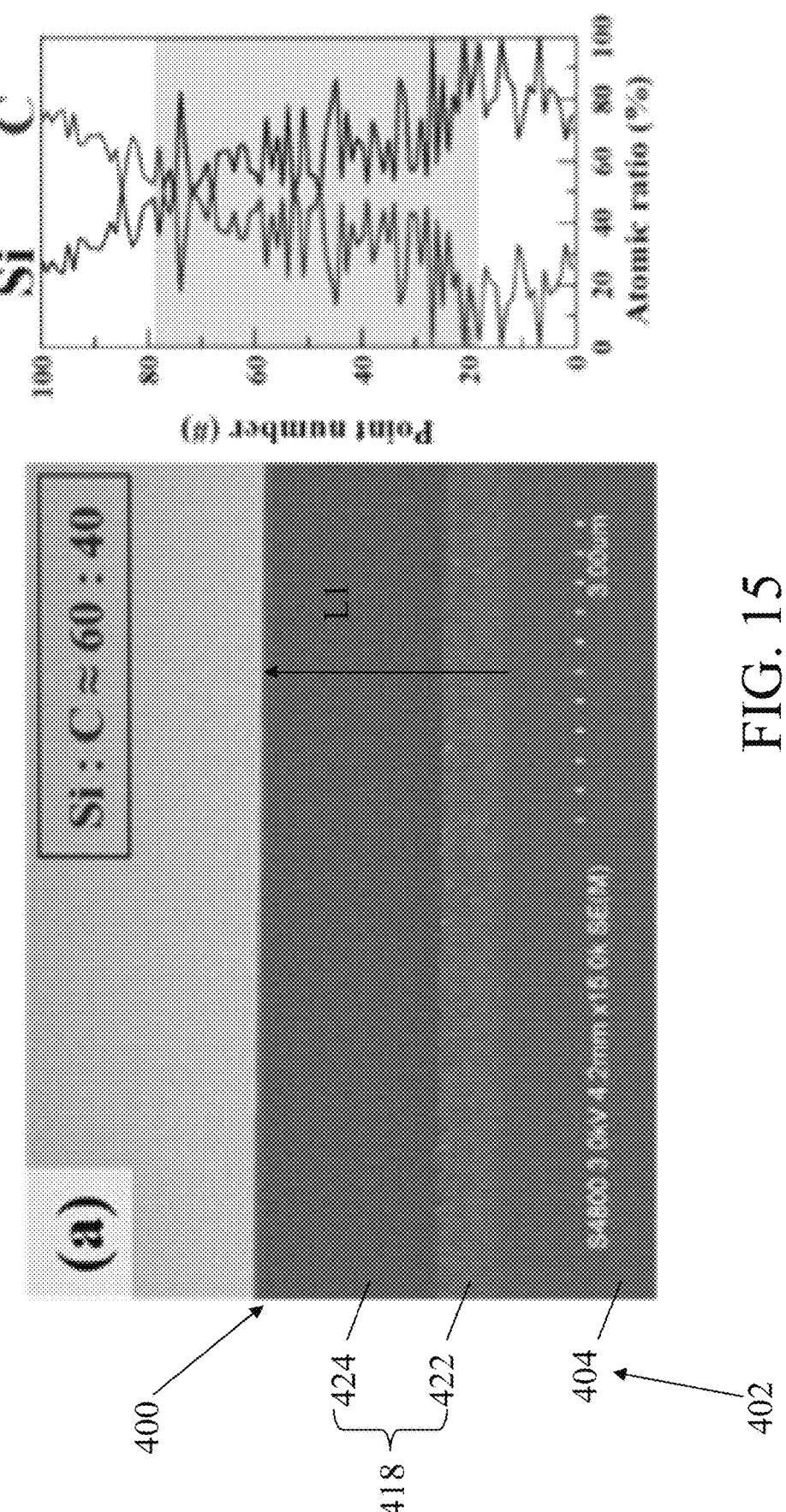
FIGS. 15 to 17 show the cross-sectional microstructure and composition distribution of the silicon carbide compound films obtained under different acetylene flow rates: (a) 20 sccm, (b) 30 sccm, and (c) 50 sccm, in accordance to preferred embodiments of the present invention.

FIG. 15 is a scanning electron microscope (SEM) image of an example of the part 400. In the process for making this example, the sputtering gas is Ar with a flow rate ranging from 0.1 slm to 100 slm, but other ranges are also possible based on practical requirements. The hydro-carbon gas is $C_2H_2$ with a flow rate ranging from 0.1 sccm to 1000 sccm, but other ranges are also possible based on practical requirements. The pressure within the chamber 302 ranges from $10^{-1}$ torr to $10^{-2}$ torr, but other ranges are also possible based on practical requirements. The plasma power for ionizing the sputtering gas initially ranges from 0.1 kW to 1 kW, but other ranges are also possible based on practical requirements. Then, the plasma power is increased to a range of 1 kW to 100 kW, but other ranges are also possible based on practical requirements. The temperature of the deposition process may be below 250° C., but other ranges are also possible based on practical requirements. For example, a deposition temperature of 700° C. can increase the ratio of crystalline silicon carbide which enhances the etch resistance capability of the protective coating 418. In other words, in some embodiments of the method for making the part 400, at least one of the flow rate of the sputtering gas, the flow rate of the hydro-carbon gas, and the plasma power for ionizing the sputtering gas dynamically changes and ends up with a larger numerical value compared to an initial numerical value (i.e., the abovementioned values may be dynamically increased) during the process of formation of the protective coating 418.

With reference to FIGS. 15 to 18, the present application uses the aforementioned production method, with monoc-rystalline silicon as the silicon target 11, argon as the sputtering gas 14, and acetylene as the hydro-carbon gas 15, the cross-sectional microstructure and composition distribution of the silicon carbide compound film 16 obtained under different acetylene flow rates: (a) 20 sccm, (b) 30 sccm, and (c) 50 sccm are shown. As the acetylene flow rate increases from 20 sccm to 50 sccm, the silicon/carbon mole ratio of the silicon carbide compound film increases from 60/40, 50/50 to 25/75.

Figure 18:
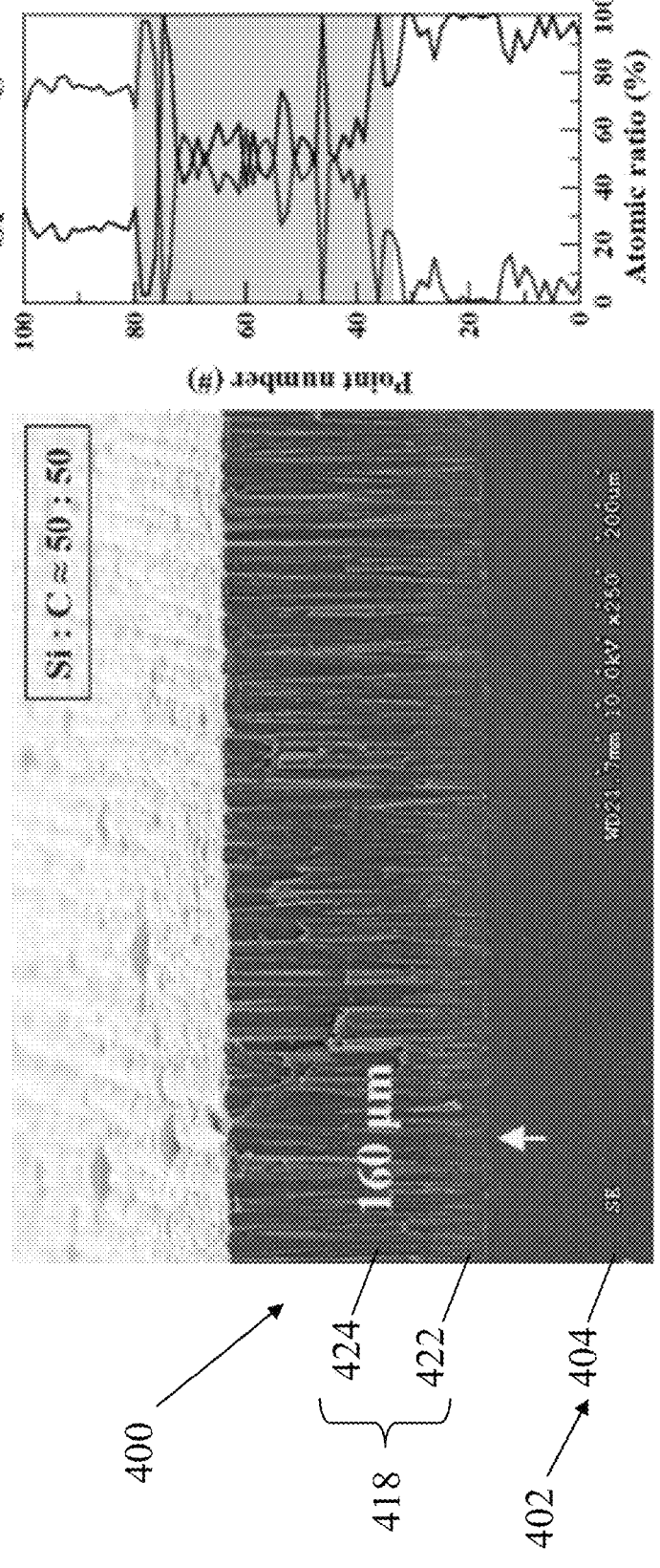
FIG. 18 shows the cross-sectional microstructure and composition distribution of the silicon carbide compound films obtained after 16 hours of processing time in accordance to a preferred embodiment of the present invention.

With reference to FIG. 18, the present application uses the aforementioned production method, with monocrystalline silicon as the silicon target 11, argon as the sputtering gas 14, and acetylene as the hydro-carbon gas 15, the cross-sectional microstructure and composition distribution of the silicon carbide compound film 16 obtained after 16 hours of processing time are shown. In this preferred embodiment, after 16 hours of processing time, the silicon/carbon mole ratio of the silicon carbide compound film 16 is 50/50, and the film thickness can reach 160 μm.

From the results of FIGS. 15 to 18, the silicon/carbon mole ratio of the silicon carbide compound film 16 can be controlled by the flow rate of the hydro-carbon gas 15. Additionally, by adjusting the process parameters, the growth rate/yield of the silicon carbide compound film 16 produced by the present invention can reach over 5 μm/h in thickness, and preferably over 10 μm/h. The thickness of the silicon carbide compound film 16 can reach over 150 μm, depending on the reaction time.

Figure 16:
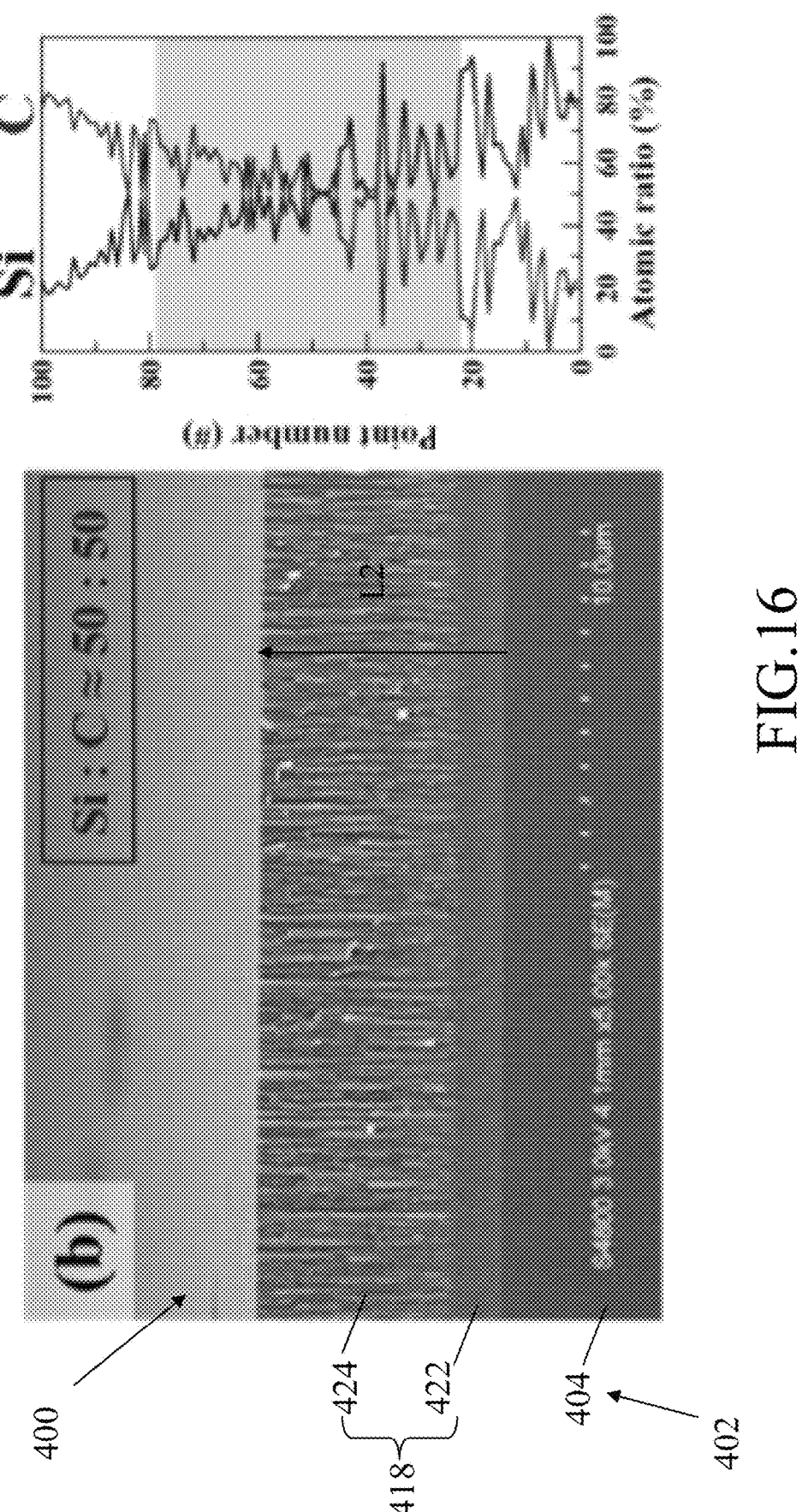
Figure 17:
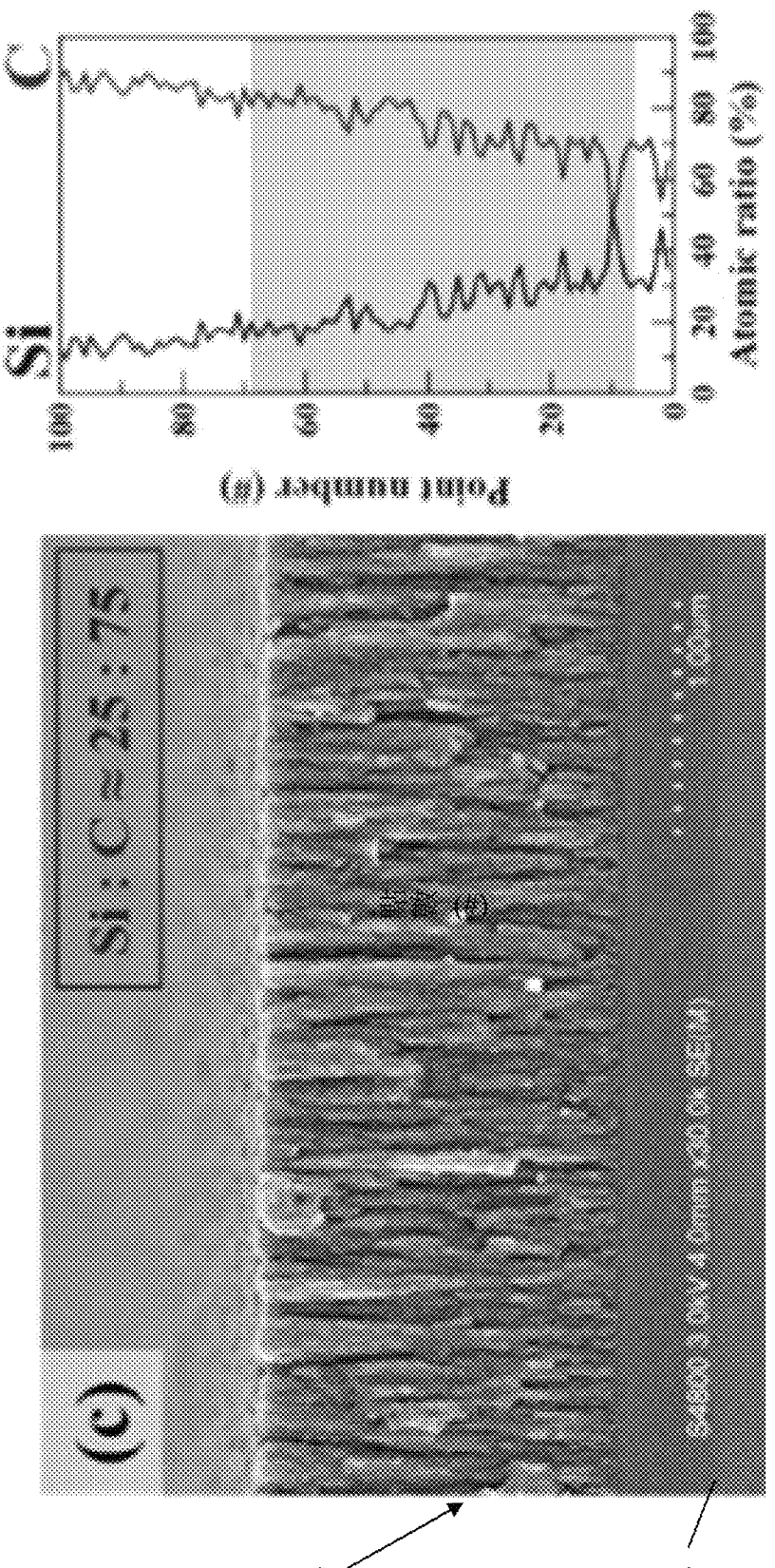

As shown in FIGS. 15 and 16, the silicon carbide compound film 16 or the protective coating 418 of the part 400 was formed to have a first portion 422 and a second portion 424. The first portion 422 is connected to the substrate 402 and the second portion 424, and has a larger atomic ratio of silicon near the substrate 402 than that of the second portion 424.

As shown in FIG. 15, the carbon content (i.e., the atomic ratio of carbon) in the protective coating 418 increases along the line (L1) (e.g., increases in a direction away from the substrate 402), and the silicon content (i.e., the atomic ratio of silicon) in the protective coating 418 decreases in the direction away from the substrate 402. In other words, an atomic ratio of silicon is larger than the atomic ratio of carbon near the substrate 402. On the contrary, the atomic ratio of silicon is smaller than the atomic ratio of carbon near the outer surface of the protective coating 418 away from the substrate 402. More specifically, the atomic ratio of silicon is larger than 75% while that of carbon is smaller than 25% near the substrate 402 and the atomic ratio of carbon is about 70% while that of silicon is about 30% near the outer surface of the protective coating 418. The average relative content of silicon to carbon in the protective coating 418 is near 3/2 (i.e., Si:C=60:40). The curve of silicon element and the curve of carbon intersect at a point larger than one half of the distance from the substrate 402. As a result, the silicon content as a whole would be larger than the carbon content as a whole in the protective coating 418. When the substrate 402 is made of silicon, and by having the protective coating 418 with a high silicon content close to the substrate 402, the protective coating 418 may be more firmly adhered to the substrate 402. As shown in FIG. 16, the carbon content (i.e., atomic ratio of carbon) in the protective coating 418 increases along the line (L2) (e.g., increases in a direction away from the substrate 402), and the silicon content (i.e., atomic ratio of silicon) in the protective coating 418 decreases in the direction away from the substrate 402. In other words, an atomic ratio of silicon is larger than that of carbon near the substrate 402. On the contrary, the atomic ratio of silicon is smaller than that of carbon near the outer surface of the protective coating 418 away from the substrate 402. More specifically, the atomic ratio of silicon is larger than 70, while that of carbon is smaller than 30% near the substrate 402 and the atomic ratio of carbon is larger than 70% while that of silicon is smaller than 30% near the outer surface of the protective coating 418. The average relative content of silicon to carbon in the protective coating 418 is near 1 (i.e., Si:C=50:50). The curve of silicon element and the curve of carbon intersect at a point around one half of the distance from the substrate 402. As a result, the carbon content as a whole would be nearly equal to the silicon content as a whole in the protective coating 418.

Figure 19:
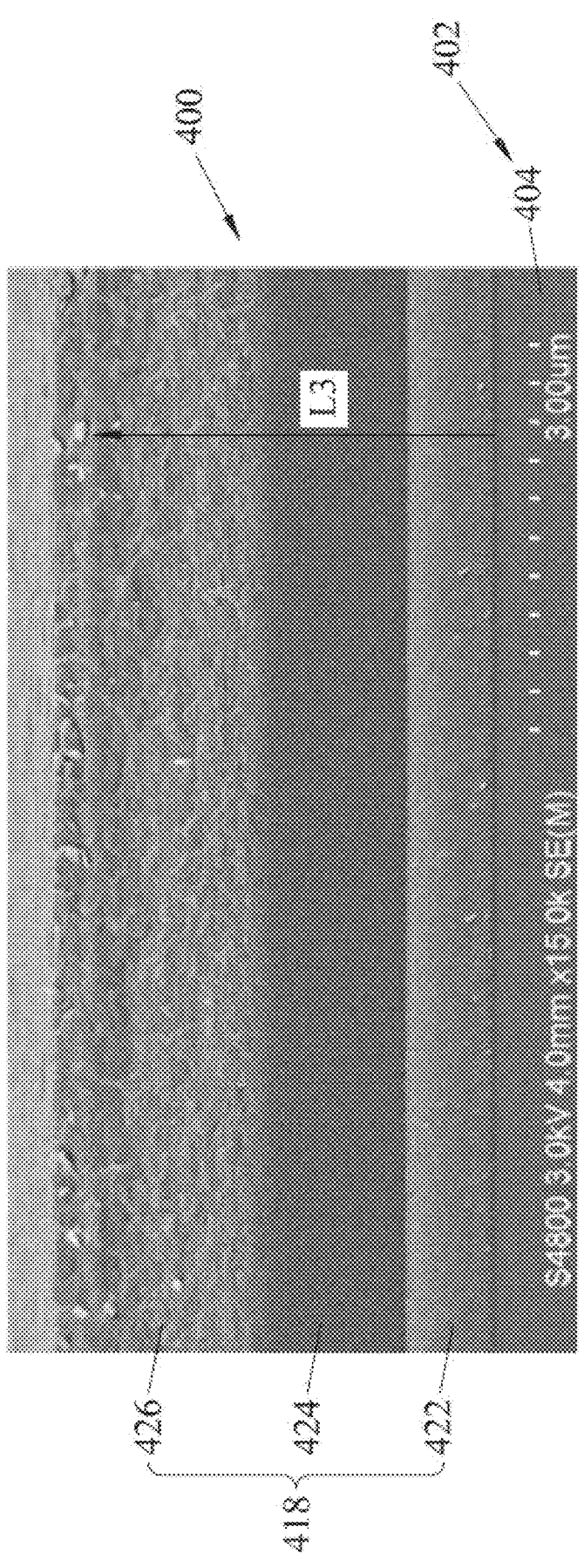
FIG. 19 is an SEM image of yet another example of the part.

FIG. 19 is an SEM image of yet another example of the part 400. In the process for making this example, the sputtering gas is Ar with a flow rate ranging from 0.1 slm to 100 slm, but other ranges are also possible based on practical requirements. The hydro-carbon gas is $C_2H_2$ with a flow rate ranging from 0.1 sccm to sccm, but other ranges are also possible based on practical requirements. The pressure within the chamber ranges from $10^{-1}$ torr to $10^{-2}$ torr, but other ranges are also possible based on practical requirements. The plasma power for ionizing the sputtering gas initially ranges from 0.1 kW to 100 kW, but other ranges are also possible based on practical requirements. Then, the plasma power is increased to a range of 0.1 kW to 1 kW, but other ranges are also possible based on practical requirements. Afterwards, the plasma power is further increased to a range of 1 kW to 100 kW, but other ranges are also possible based on practical requirements. The temperature of the deposition process may be below 250° C., but other ranges are also possible based on practical requirements. For example, a deposition temperature of 700° C. can increase the ratio of crystalline silicon carbide which enhances the etch resistance capability. In other words, in some embodiments of the method for making the part 400, at least one of the flow rate of the sputtering gas, the flow rate of the hydro-carbon gas, and the plasma power for ionizing the sputtering gas dynamically changes and ends up with a larger numerical value compared to an initial numerical value (i.e., the abovementioned values may be dynamically increased) during the process of formation of the protective coating 418.

As shown in FIG. 19, the protective coating 418 of the part 400 was formed to have the first portion 422, the second portion 424 and a third portion 426. The first portion 422 is connected to the substrate 402 and the second portion 424, and the third portion 426 is connected to the second portion 424 and is opposite to the first portion 422. The third portion 426 has a larger atomic ratio of carbon near outer surface of the protective coating 418 than that of the first portion 422 near the substrate 402.

Figure 20:
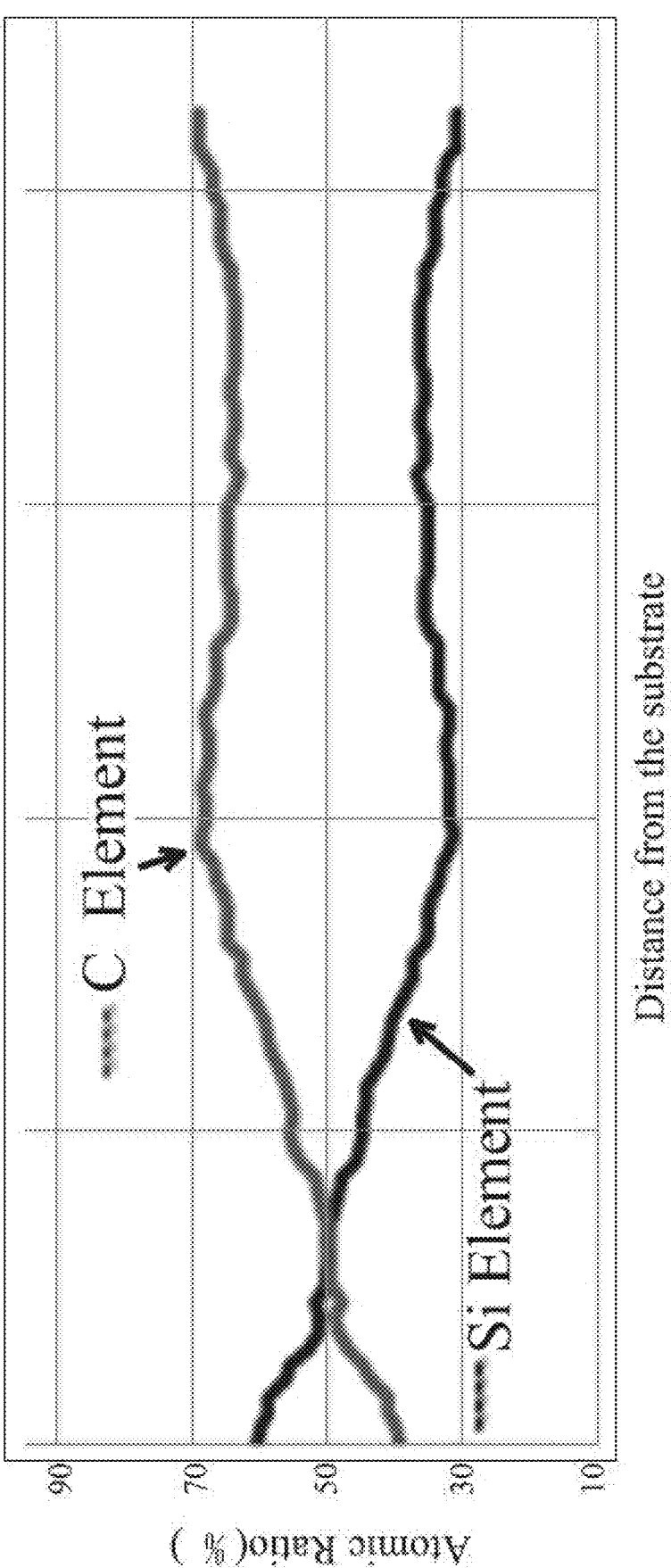
FIG. 20 shows a result of EDS analysis of the protective coating of the example shown in FIG. 19.

FIG. 20 is a chart showing the result of EDS analysis taken along line (L3) of FIG. 19. As shown in FIGS. 19 and 20, the carbon content (i.e., the atomic ratio of carbon) in the protective coating 418 increases along the line (L3) (e.g., increases in a direction away from the substrate 402), and the silicon content (i.e., the atomic ratio of silicon) in the protective coating 418 decreases in the direction away from the substrate 402. In other words, an atomic ratio of silicon is larger than that of carbon near the substrate 402. On the contrary, the atomic ratio of silicon is smaller than that of carbon near the outer surface of the protective coating 418 away from the substrate 402. More specifically, the atomic ratio of silicon is larger than 55% while that of carbon is smaller than 45% near the substrate 402 and the atomic ratio of carbon is about 70% while that of silicon is about 30% near the outer surface of the protective coating 418. The average relative content of silicon to carbon in the protective coating 418 is near two-thirds (i.e., Si:C=40:60). The curve of silicon element and the curve of carbon intersect at a point less than one half of the distance from the substrate 402. As a result, the carbon content as a whole would be larger than the silicon content as a whole in the protective coating 418.

In some embodiments, the relative content of silicon to carbon in the protective coating 418 (i.e., silicon carbide) ranges from two-thirds to one-and-a-half, but other ranges are also possible based on practical requirements.

Figure 21:
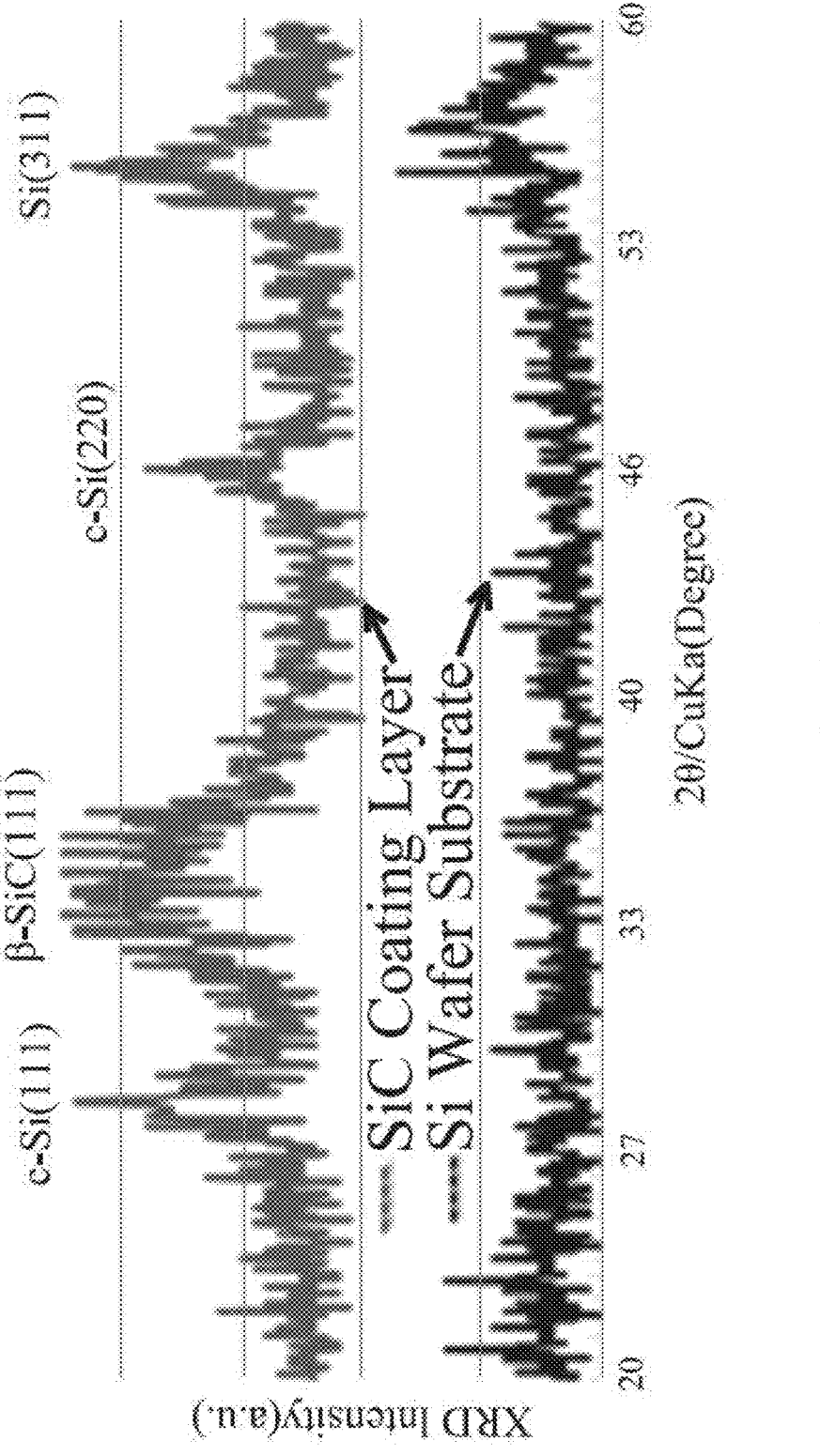
FIG. 21 shows a result of XRD analysis of the protective coating of the example shown in FIG. 19.

FIG. 21 is the result of XRD analysis of the surface of the protective coating 418 shown in FIG. 19. The protective coating 418 at least contains c-Si (111), c-Si (220), 3C-SiC such as β-SiC (111) (i.e., crystalline cubic SiC).

Figure 22:
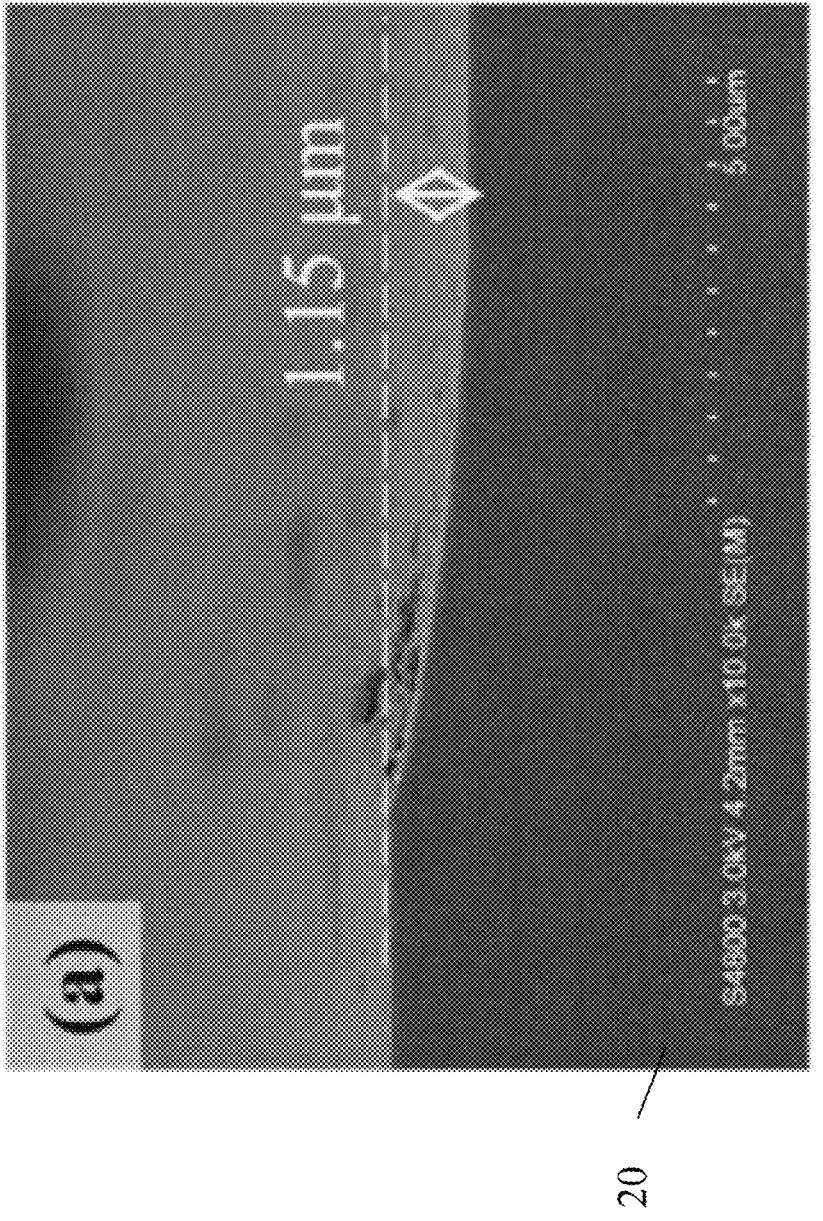
FIG. 22 shows the cross-sectional microstructure of a bare silicon wafer after 200 seconds of plasma etching in a SF6 atmosphere, as a comparative embodiment.
Figure 23:
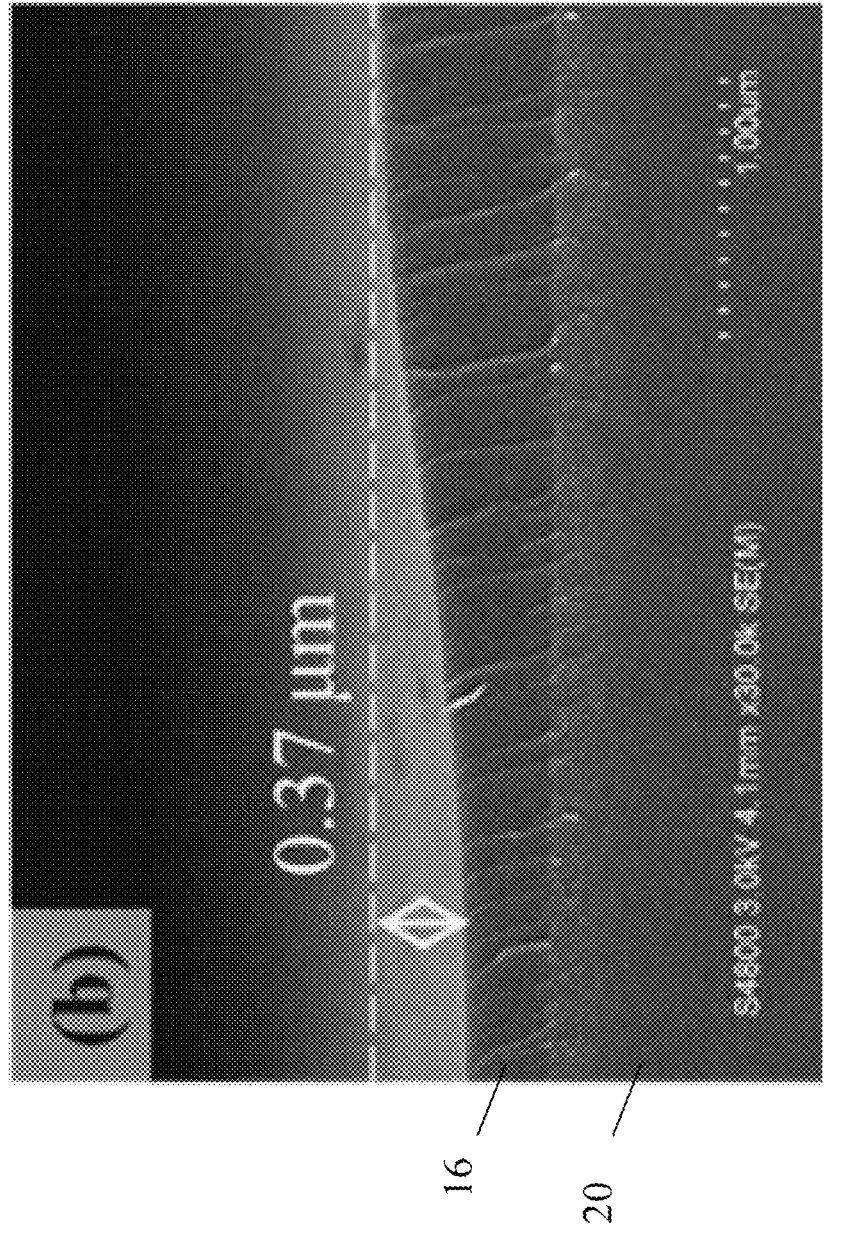
FIG. 23 shows the cross-sectional microstructure of the silicon carbide compound films obtained by a preferred embodiment of the present invention after 200 seconds of plasma etching in a $SF_6$ atmosphere.
Figure 25:
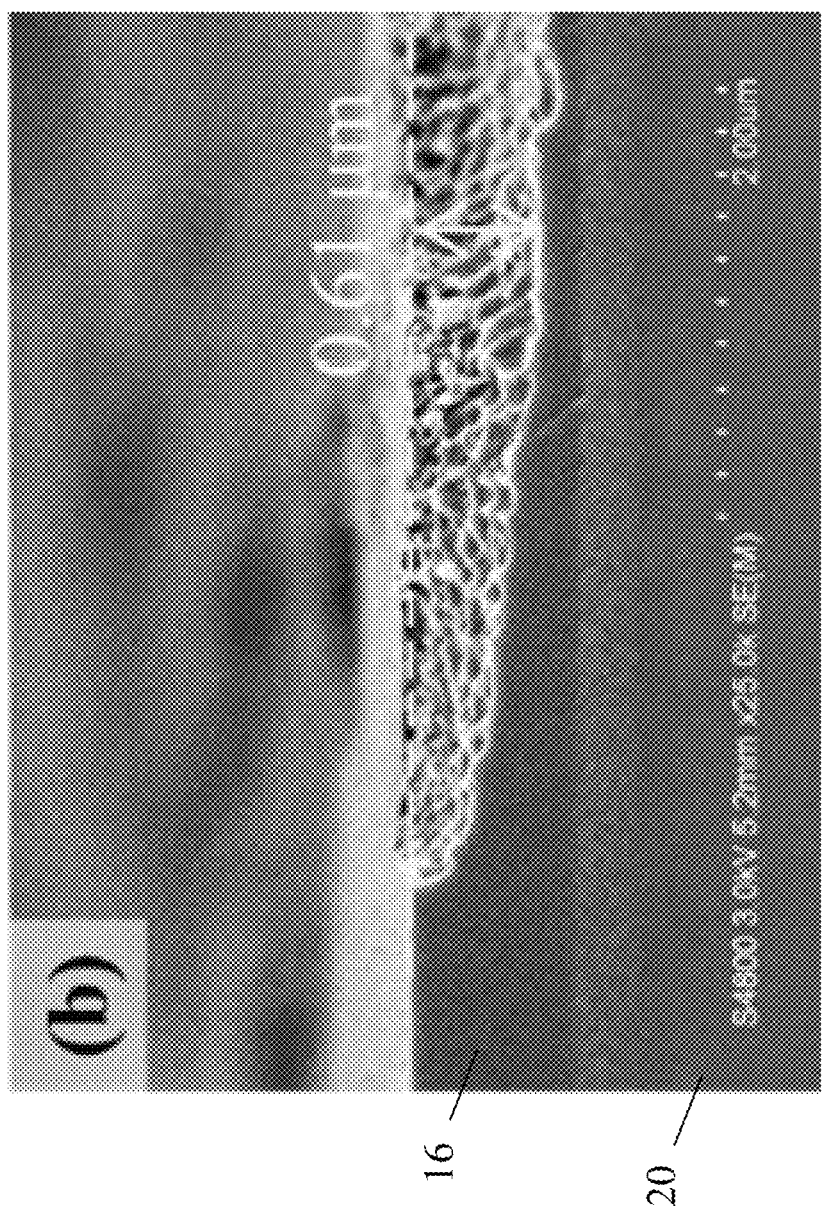
FIG. 25 shows the cross-sectional microstructure of the silicon carbide compound films obtained according to a preferred embodiment of the present invention after 200 seconds of plasma etching in a $SF_6$ and $Cl_2$ atmosphere.

With reference to FIGS. 22 and 25, FIG. 22 shows a comparative embodiment of a bare silicon wafer substrate 20, and FIG. 23 shows the silicon carbide compound film 16 produced by the present invention. FIGS. 22 and 23 show a cross-sectional microstructure of the bare silicon wafer 20 and the embodiment of the present invention after 200 seconds of plasma etching in a $SF_6$ atmosphere. FIG. 22 shows that an etching depth of the bare silicon wafer is 1.15 μm, while the etching depth of the present invention is only 0.37 μm in FIG. 23. The present invention has an etching rate that is 3.1 times slower than that of the bare silicon wafer proving improved erosion resistance ability to the $SF_6$ atmosphere.

Figure 24:
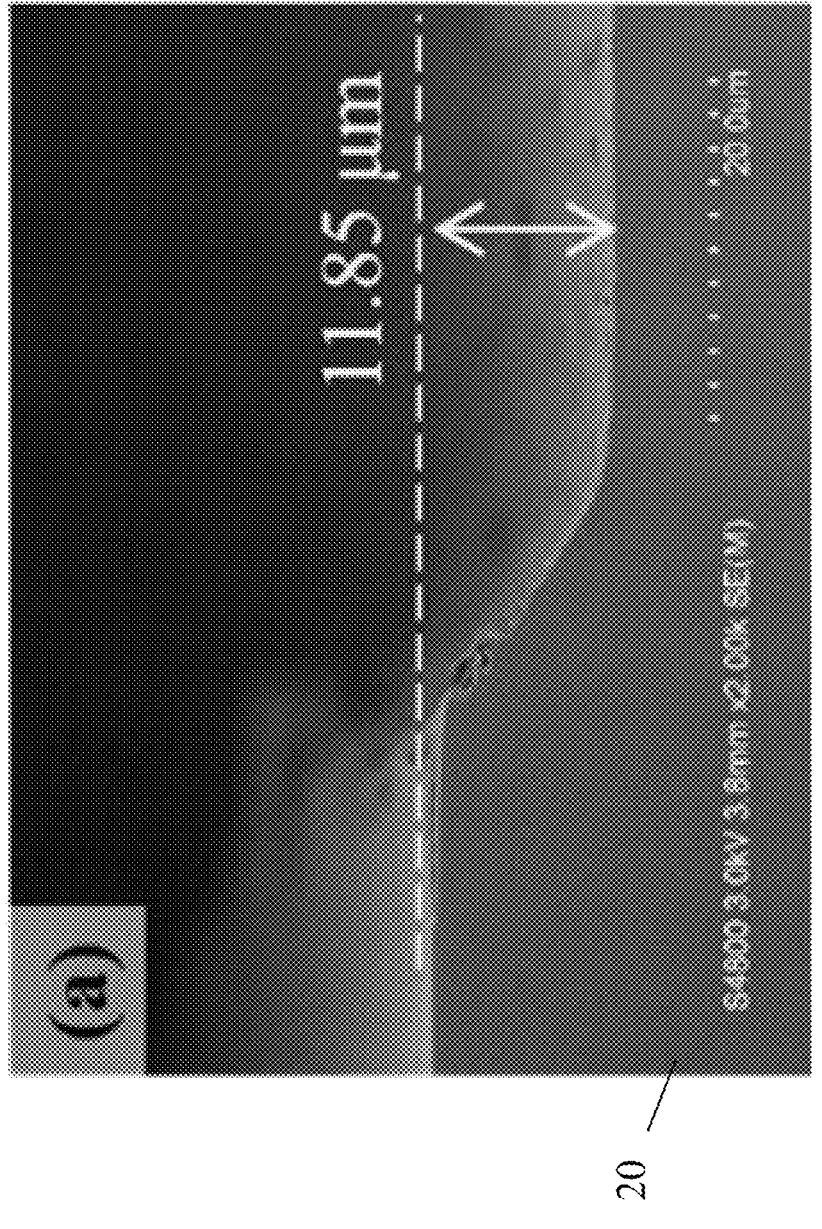
FIG. 24 shows the cross-sectional microstructure of a bare silicon wafer after 200 seconds of plasma etching in a $SF_6$ and $Cl_2$ atmosphere, as a comparative embodiment.

FIG. 24 shows a comparative embodiment of a bare silicon wafer, and FIG. 25 shows the silicon carbide compound film 16 produced by the present invention. This test compares the cross-sectional microstructure of the bare silicon wafer and the embodiment of the present invention after 200 seconds of plasma etching in a $SF_6$ and $Cl_2$ atmosphere. FIGS. 24 and 25 show that the etching depth of the bare silicon wafer is 11.85 μm, while the etching depth of the embodiment of the present invention is only 0.61 μm. The present invention has an etching rate that is 19.4 times slower than that of the bare silicon wafer proving an improved erosion resistance ability to the $SF_6$ and $Cl_2$ atmosphere.

From FIGS. 22 to 25, the silicon carbide compound film 16 produced by the present invention has a plasma etching rate that is ten times slower than that of the bare silicon wafer in a fluorine-containing or fluorine-containing and chlorine-containing mixing plasma etching atmosphere, indicating its plasma-resistant capability. Therefore, the silicon carbide compound film 16 has the effectiveness of surface modification of various components inside plasma etching equipment, thereby increasing their lifespan, preventing chamber contamination, and improving wafer characteristics and yield.

In the aforementioned embodiments, the protective coating 418 may have a crystalline ratio ranging from 0% to 100%. In other embodiments with higher process temperature or an annealing temperature up to 700° C., the crystalline ratio may be up to 100%. That is, other ranges are also possible based on practical requirements. The crystalline ratio of the protective coating 418 in accordance with some embodiments of this disclosure may range from 0% to 5%, from 5, to 10%, from 10% to 15%, from 15% to 17%, from 17% to 20%, from 20% to 25%, from 25 to 30%, from 35% to 40%, from 40% to 45%, from 45 to 50%, from 50% to 55%, from 55% to 60%, or other ranges of values, such as 80% when the process temperature or an annealing temperature up to 600° C.

Figure 26:
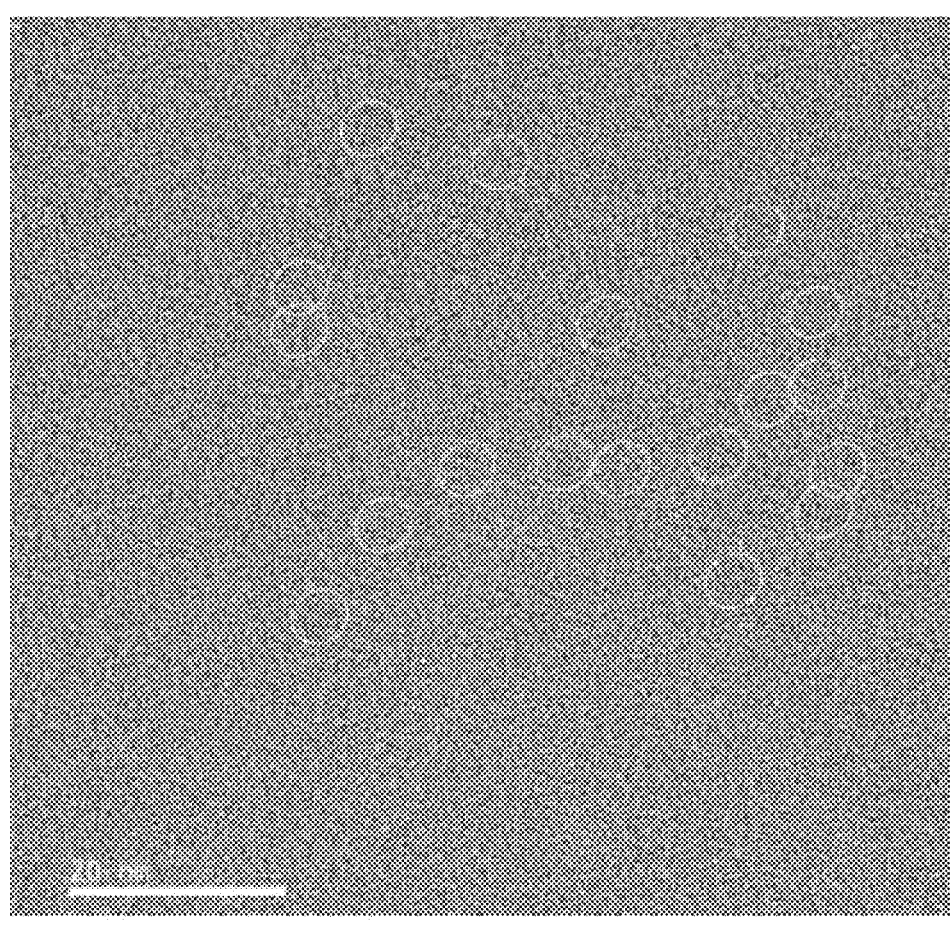
FIGS. 26 to 31 show high resolution transmission electron microscope images and diffraction patterns of the samples of FIGS. 15, 16 and 19.

FIG. 26 is a high resolution transmission electron microscope (HRTEM) image of the sample in FIG. 15 taken by

11

12

Figure 27:
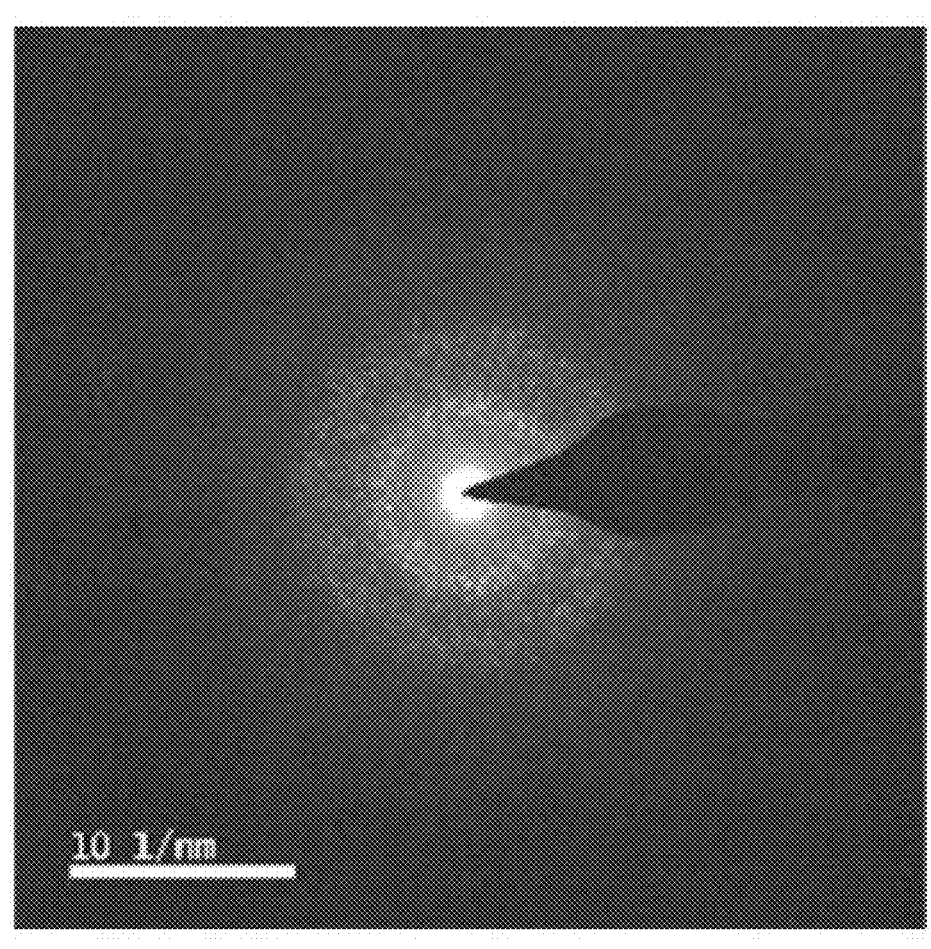

JEOL Model JEM-2100F. Moreover, FIG. 27 shows the corresponding diffraction pattern of the example as shown in FIG. 15. The detected position shown in FIGS. 26 and 27 is 1 μm deep from the outer surface of protective coating 418 as shown in FIG. 15. The circles formed by white dots represent the area of crystalline and the crystalline ratio was calculated to be 5% from the result of FIG. 26.

Figure 28:
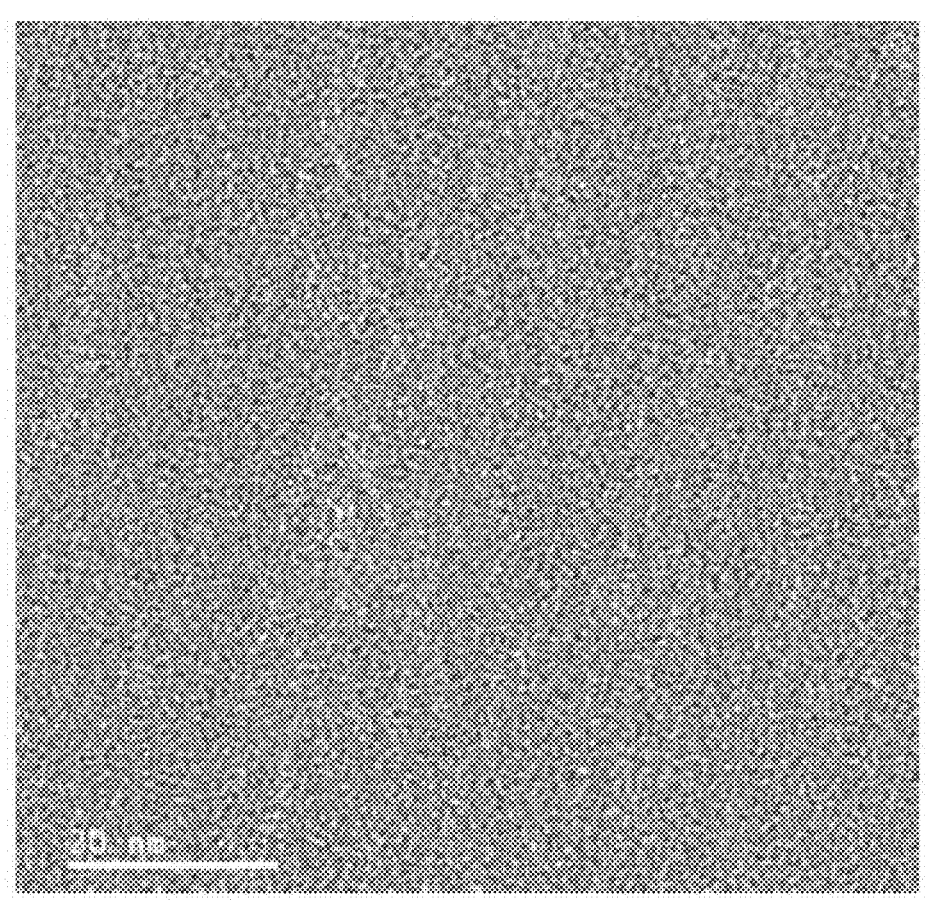
Figure 29:
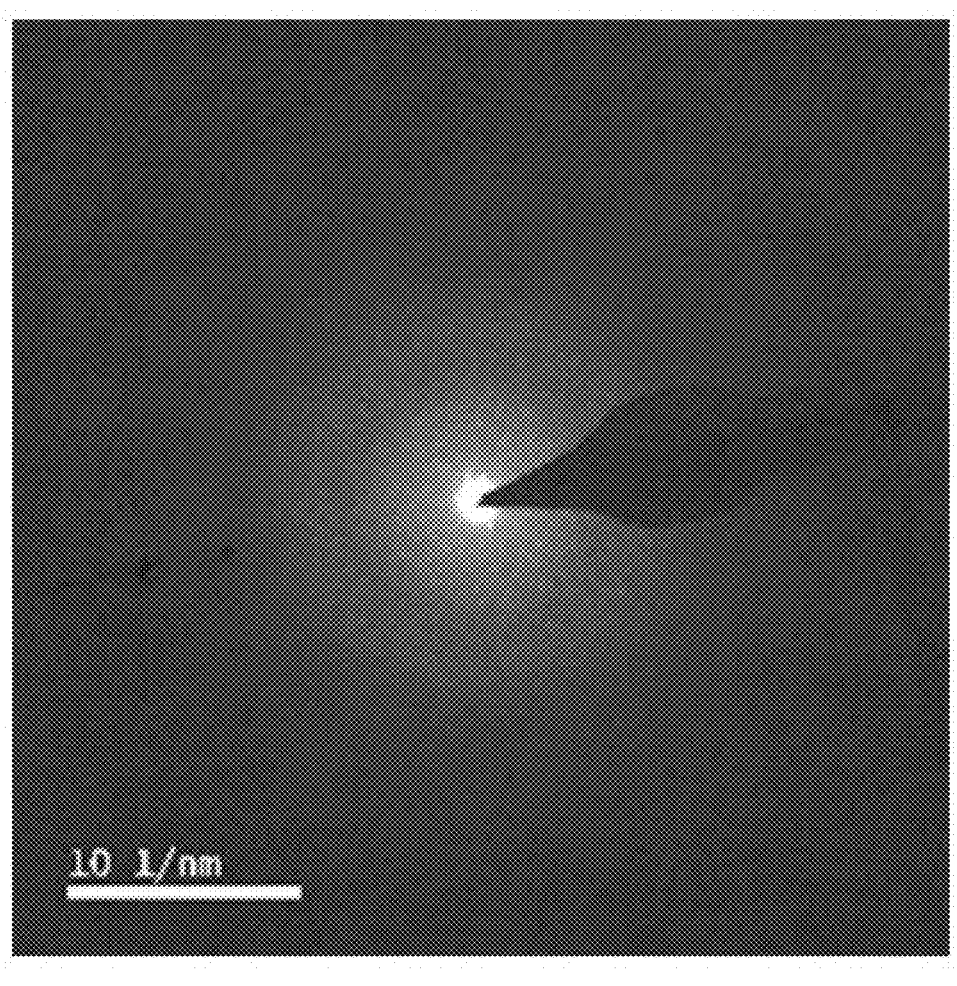

FIG. 28 is an HRTEM image of the sample in FIG. 16 taken by JEOL Model JEM-2100F. Moreover, FIG. 29 shows the corresponding diffraction pattern of the example as shown in FIG. 16. The detected position shown in FIGS. 28 and 29 is 1 μm deep from the outer surface of protective coating 418 as shown in FIG. 16. The crystalline ratio was calculated to be 0% from the result of FIG. 28, which represents the existence of amorphous SiC.

Figure 30:
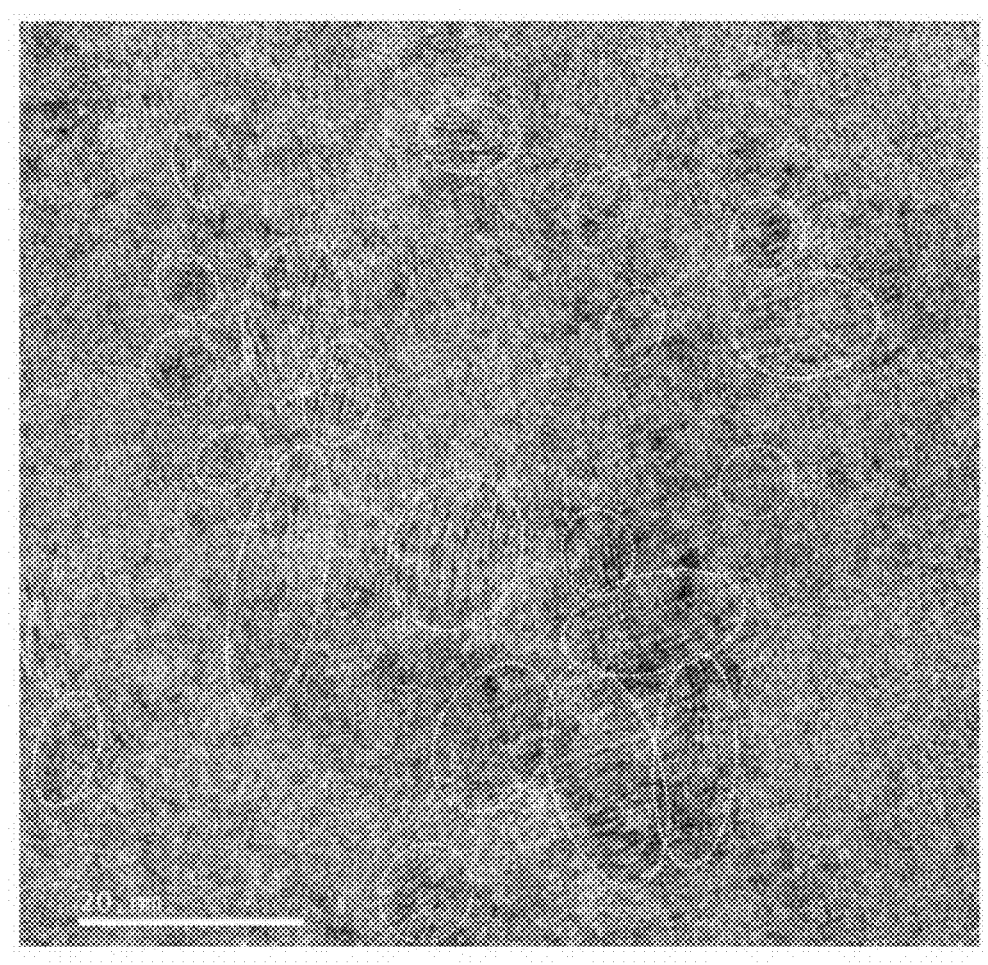
Figure 31:
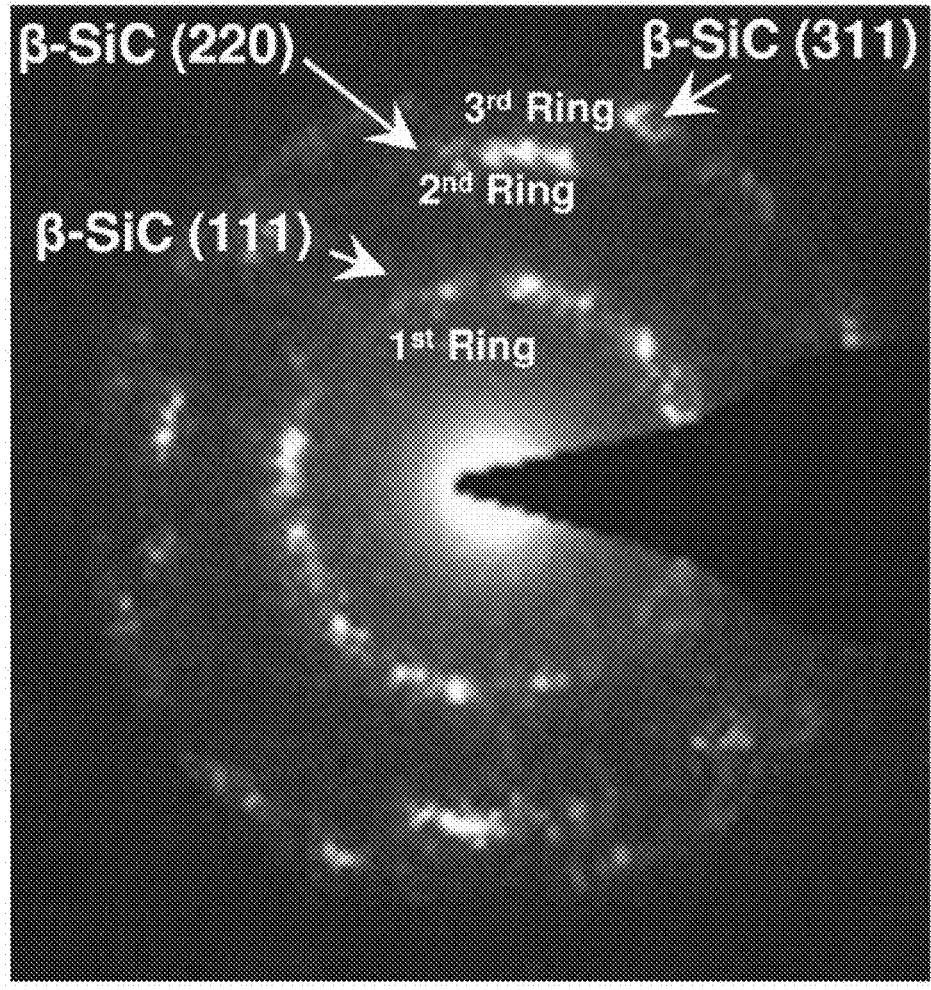

FIG. 30 is an HRTEM image of the sample in FIG. 19 taken by JEOL Model JEM-2100F. Moreover, FIG. 31 shows the corresponding diffraction pattern of the example as shown in FIG. 19. The detected position shown in FIGS. 30 and 31 is 1 μm deep from the outer surface of protective coating 418 as shown in FIG. 19. The circles formed by white dots represent the area of crystalline and the crystalline ratio was calculated to be 70% from the result of FIG. 30. As shown in FIG. 31, there are three rings in the diffraction pattern in FIG. 31. The first ring near the center represents β-SiC (111). The second ring near the first ring represents β-SiC (220). The third ring outermost represents β-SiC (311). That is, except β-SiC (111), the area of crystalline structure further includes β-SiC (220) and β-SiC (311). Compared to XRD, HRTEM can measure nano scale area and the diffraction pattern is more specific to realize the compound of crystalline structures.

Since the silicon surface atomic density of silicon (111) and (100) surfaces are $7.83 \times 10^{14}/cm^2$ and $6.78 \times 10^{14}/cm^2$, respectively, more silicon fluoride bonds or silicon chloride bonds of etching byproducts are needed to be formed on the silicon (111) surface compared to those on the silicon (100) surface. Therefore, the etch rate of silicon (111) can be lower than that of silicon (100). In other words, the aforementioned embodiments having c-Si (111) also can decrease the etch rate of various etchant gases, such as gaseous $CF_4$, $SiF_6$, $Cl_2$, etc.

Moreover, the etch resistance capability may be higher when the relative content ratio of carbon to silicon as a whole in the protective coating 418 (i.e., silicon carbide) is larger than 1, such as 1.5, but other ranges larger than one, for example, 1.1, 1.3 or 1.8, are also possible based on practical requirements.

In addition, the resistance of the protective coating 418 in the aforementioned embodiments can be adjusted to a target value such as the same value as that of substrate 402 or other values by doping nitrogen element.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A production method of silicon carbide compounds comprising steps of:
   providing a hollow cathode unit; wherein the hollow cathode unit comprises two silicon targets placed parallel to each other within a case forming a slit therebetween defining a slit inlet and a slit outlet;
   applying a plasma power to the two silicon targets to ignite a hollow cathode discharge silicon plasma in a reduced-pressure environment;
   introducing a sputtering gas through the slit inlet to blow out the hollow cathode discharge silicon plasma, and introducing a hydro-carbon gas near the slit outlet; and the hydro-carbon gas is a non-ionized gas; and
   reacting the hollow cathode discharge silicon plasma with the hydro-carbon gas to form a silicon carbide compound film, wherein the protective coating layer has a gradient composition such that, near the substrate surface, a silicon atom concentration exceeds a carbon atom concentration, and near an outer surface of the coating, the carbon atom concentration exceeds the silicon atom concentration, and the silicon carbide compound film provides resistance to plasma etching;
   wherein the flow rate of the hydrocarbon gas is selectively adjusted such that the molar ratio of silicon to carbon in the resulting silicon carbide compound film is tunable.

2. The method as claimed in claim 1, wherein: a flow rate of the sputtering gas and/or the hydro-carbon gas are controlled by a mass flow controller.

3. The method as claimed in claim 1, wherein: the silicon target comprises monocrystalline silicon, polycrystalline silicon, amorphous silicon, or a combination thereof.

4. The method as claimed in claim 1, wherein the silicon carbide compound film has a crystalline ratio ranging from 0% to 100%.

5. The method as claimed in claim 1, wherein: the sputtering gas comprises Ar, He, Ne, Kr, or any combination thereof.

6. The method as claimed in claim 1, wherein: the hydro-carbon gas comprises methane, ethane, ethylene, propylene, acetylene, or combination thereof.

7. The method as claimed in claim 2, wherein: the hydro-carbon gas comprises methane, ethane, ethylene, propylene, acetylene, or combination thereof.

8. The method as claimed in claim 1, wherein: the substrate includes metallic or non-metallic surfaces.

9. The method as claimed in claim 8, wherein: the non-metallic surfaces include ceramics or polymers.

10. The method as claimed in claim 1, wherein: the silicon carbide compound film is a compound formed by the reaction of the hollow cathode discharge silicon plasma and the hydro-carbon gas which represented by a molecular formula $Si_x C_y$, where x and y represent mole numbers of silicon and carbon, respectively, and x and y represent any positive number.

11. The method as claimed in claim 1, further comprising heating or annealing the substrate to a temperature lower than the melting points of the silicon carbide compound film and the substrate.

12. The method as claimed in claim 1, wherein a flow rate of the sputtering gas is at a range from 0.1 slm to 100 slm.

13. The method as claimed in claim 1, wherein: a flow rate of the hydro-carbon gas may range from 0.1 sccm to 1000 sccm.

* * * * *